(12) United States Patent
Suganuma et al.

(10) Patent No.: US 9,685,756 B2
(45) Date of Patent: Jun. 20, 2017

(54) LASER AMPLIFIER, LASER APPARATUS, AND EXTREME ULTRAVIOLET LIGHT GENERATING SYSTEM

(71) Applicant: GIGAPHOTON INC., Tochigi (JP)

(72) Inventors: Takashi Suganuma, Tochigi (JP); Hideo Hoshino, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/040,588

(22) Filed: Feb. 10, 2016

(65) Prior Publication Data

US 2016/0172820 A1 Jun. 16, 2016

Related U.S. Application Data

(63) Continuation of application No. PCT/JP2014/072402, filed on Aug. 27, 2014.

(30) Foreign Application Priority Data

Sep. 5, 2013 (JP) .................... PCT/JP2013/073987

(51) Int. Cl.
*A61N 5/06* (2006.01)
*H01S 3/23* (2006.01)
(Continued)

(52) U.S. Cl.
CPC ........ *H01S 3/2316* (2013.01); *G03F 7/70033* (2013.01); *H01S 3/081* (2013.01);
(Continued)

(58) Field of Classification Search
CPC ............................ H01S 3/2316; G03F 7/70033
(Continued)

(56) References Cited

U.S. PATENT DOCUMENTS 5,412,681 A * 5/1995 Eisel ..................... H01S 3/0315
372/19
5,930,282 A * 7/1999 Unternahrer .......... H01S 3/0941
372/107
(Continued)

FOREIGN PATENT DOCUMENTS

JP H03-261191 A 11/1991
JP 2006-179600 A 7/2006
(Continued)

OTHER PUBLICATIONS

International Search Report of PCT/JP2014/072402 mailed Nov. 11, 2014.

*Primary Examiner* — Jason McCormack
(74) *Attorney, Agent, or Firm* — Studebaker & Brackett PC

(57) ABSTRACT

There may be provided a laser amplifier including: a chamber containing a laser medium; a first window provided on the chamber, and configured to allow a laser light beam inputted from outside of the chamber to enter the chamber; an excitation unit configured to amplify, by exciting the laser medium, the laser light beam that has entered the chamber; a second window provided on the chamber, and configured to allow the laser light beam that has been amplified by the excitation unit to exit from the chamber to the outside; a mirror provided on a laser light path between the first window and the second window; and a wavelength selection film provided on one or more of the first window, the second window, and the mirror, and configured to suppress propagation of light beams of one or more suppression target wavelengths different from a desired wavelength.

8 Claims, 24 Drawing Sheets

(51) Int. Cl.

| | | |
|---|---|---|
| *H01S 3/08* | (2006.01) | |
| *G03F 7/20* | (2006.01) | |
| *H05G 2/00* | (2006.01) | |
| *H01S 3/081* | (2006.01) | |
| *H01S 3/223* | (2006.01) | |
| *H01S 5/34* | (2006.01) | |
| *H01S 3/0971* | (2006.01) | |
| *H01S 3/00* | (2006.01) | |

(52) U.S. Cl.
CPC ...... *H01S 3/08059* (2013.01); *H01S 3/08095* (2013.01); *H05G 2/008* (2013.01); *H01S 3/0078* (2013.01); *H01S 3/0971* (2013.01); *H01S 3/2232* (2013.01); *H01S 3/2325* (2013.01); *H01S 3/2375* (2013.01); *H01S 5/3402* (2013.01); *H01S 2301/02* (2013.01)

(58) Field of Classification Search
USPC ....................................................... 250/504 R
See application file for complete search history.

(56) References Cited

U.S. PATENT DOCUMENTS

| | | | |
|---|---|---|---|
| 2002/0105997 A1* | 8/2002 | Zhang | H01S 3/109 372/70 |
| 2010/0193710 A1* | 8/2010 | Wakabayashi | B82Y 20/00 250/504 R |
| 2010/0327192 A1 | 12/2010 | Fomenkov et al. | |
| 2012/0008650 A1* | 1/2012 | Poustie | H01S 5/028 372/20 |
| 2014/0300950 A1 | 10/2014 | Nowak et al. | |

FOREIGN PATENT DOCUMENTS

| | | |
|---|---|---|
| JP | 2009-099727 A | 5/2009 |
| JP | 2010-103104 A | 5/2010 |
| JP | 2010-186990 A | 8/2010 |
| JP | 5086677 B2 | 9/2012 |
| JP | 2013-065804 A | 4/2013 |
| JP | 2013-131724 A | 7/2013 |
| JP | 2014-187140 A | 10/2014 |
| WO | 2014/119199 A1 | 8/2014 |

* cited by examiner

LASER AMPLIFIER, LASER APPARATUS, AND EXTREME ULTRAVIOLET LIGHT GENERATING SYSTEM

CROSS REFERENCE TO RELATED APPLICATIONS

This is a continuation of International Application No. PCT/JP2014/072402, filed Aug. 27, 2014, which claims the benefit of International Application No. PCT/JP2013/073987, filed Sep. 5, 2013, the entire contents of both of which are incorporated herein by reference.

BACKGROUND

The disclosure relates to a laser amplifier, a laser apparatus, and an extreme ultraviolet (EUV) light generating system configured to generate EUV light based on pulsed laser light outputted from the laser apparatus.

In recent years, miniaturization of a transcription pattern of an optical lithography in a semiconductor process is drastically progressing with the development in fining of the semiconductor process. In the next generation, microfabrication on the order of 70 nm to 45 nm, and further microfabrication on the order of 32 nm or less are bound to be required. To meet such requirement for the microfabrication on the order of, for example, 32 nm or less, development is anticipated of an exposure apparatus that includes a combination of a reduced projection reflective optics and an extreme ultraviolet light generating apparatus that generates extreme ultraviolet (EUV) light with a wavelength of about 13 nm.

Three types of apparatuses have been proposed for the extreme ultraviolet light generating apparatus, which are a laser produced plasma (LPP) apparatus that uses plasma generated by application of laser light to a target substance, a discharge produced plasma (DPP) apparatus that uses plasma generated by electric discharge, and a synchrotron radiation (SR) apparatus that uses orbital radiation light. For example, reference is made Japanese Unexamined Patent Application Publication No. 2010-103104, Japanese Patent No. 5086677, and U.S. Patent Application Publication No. 2010/0327192.

SUMMARY

A laser amplifier according to an embodiment of the disclosure may include: a chamber containing a laser medium; a first window provided on the chamber, and configured to allow a laser light beam inputted from outside of the chamber to enter the chamber; an excitation unit configured to amplify, by exciting the laser medium, the laser light beam that has entered the chamber; a second window provided on the chamber, and configured to allow the laser light beam that has been amplified by the excitation unit to exit from the chamber to the outside; a mirror provided on a laser light path between the first window and the second window; and a wavelength selection film provided on one or more of the first window, the second window, and the mirror, and configured to suppress propagation of light beams of one or more suppression target wavelengths different from a desired wavelength.

A laser apparatus according to an embodiment of the disclosure may include: a master oscillator configured to output a laser light beam; and one or more laser amplifiers each configured to amplify the laser light beam derived from the master oscillator. One or more of the laser amplifiers each may include: a chamber containing a laser medium; a first window provided on the chamber, and configured to allow a laser light beam inputted from outside of the chamber to enter the chamber; an excitation unit configured to amplify, by exciting the laser medium, the laser light beam that has entered the chamber; a second window provided on the chamber, and configured to allow the laser light beam that has been amplified by the excitation unit to exit from the chamber to the outside; a mirror provided on a laser light path between the first window and the second window; and a wavelength selection film provided on one or more of the first window, the second window, and the mirror, and configured to suppress propagation of light beams of one or more suppression target wavelengths different from a desired wavelength.

An extreme ultraviolet light generating system according to an embodiment of the disclosure may include: a plasma chamber in which extreme ultraviolet light is to be generated; and a laser apparatus configured to supply a pulsed laser light beam into the plasma chamber. The laser apparatus may include: a master oscillator configured to output a laser light beam as a seed of the pulsed laser light beam; and one or more laser amplifiers each configured to amplify the laser light beam derived from the master oscillator. One or more of the laser amplifiers each may include: an amplification chamber containing a laser medium; a first window provided on the amplification chamber, and configured to allow a laser light beam inputted from outside of the amplification chamber to enter the amplification chamber; an excitation unit configured to amplify, by exciting the laser medium, the laser light beam that has entered the amplification chamber; a second window provided on the amplification chamber, and configured to allow the laser light beam that has been amplified by the excitation unit to exit from the amplification chamber to the outside; a mirror provided on a laser light path between the first window and the second window; and a wavelength selection film provided on one or more of the first window, the second window, and the mirror, and configured to suppress propagation of light beams of one or more suppression target wavelengths different from a desired wavelength.

BRIEF DESCRIPTION OF THE DRAWINGS

Some example embodiments of the disclosure are described below as mere examples with reference to the accompanying drawings.

DETAILED DESCRIPTION

Figure 1:
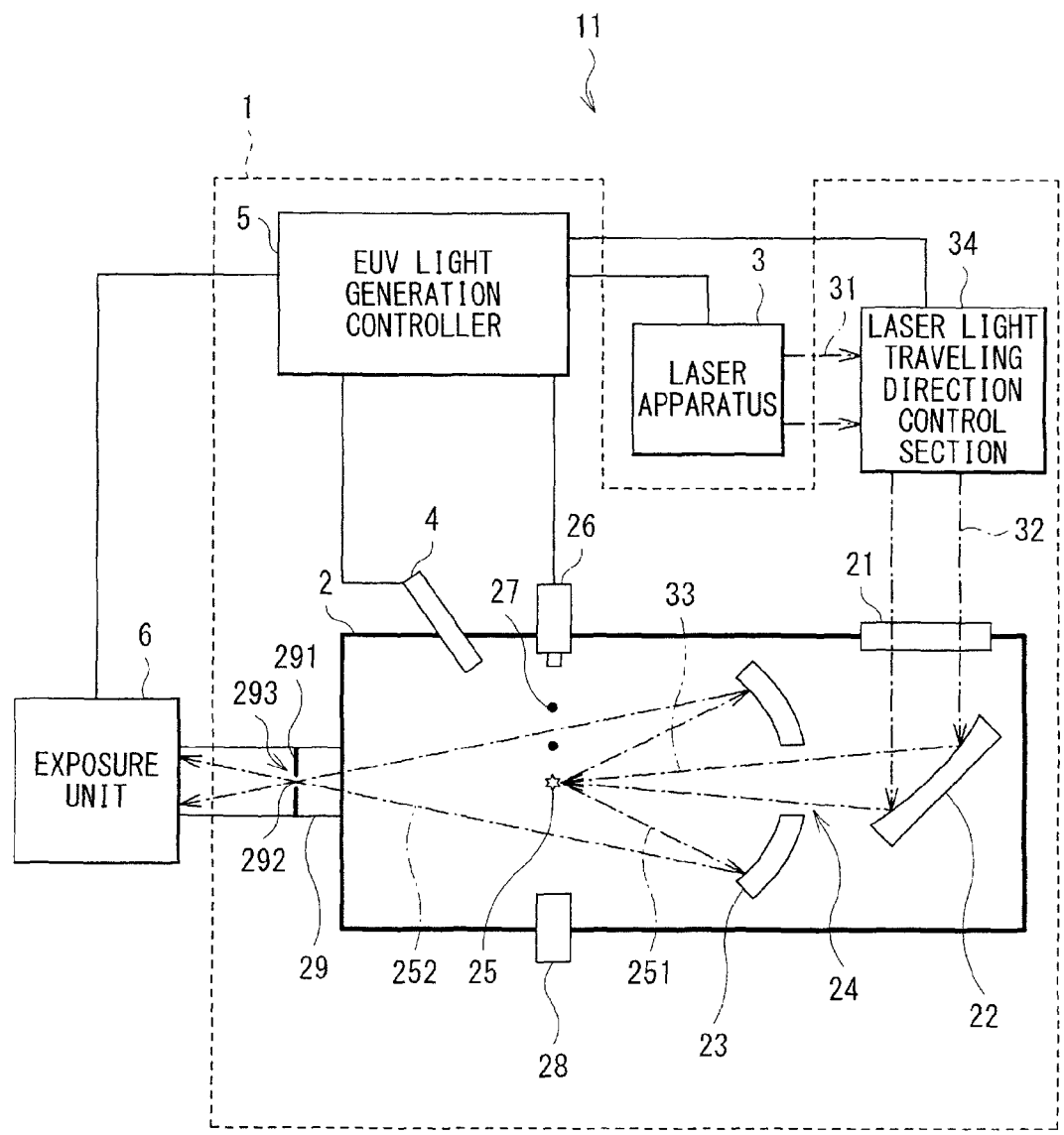
FIG. 1 schematically illustrates a configuration example of an illustrative LPP EUV light generating system.

[Contents]
[1. Outline]
[2. Overall Description of EUV Light Generating System]
   2.1 Configuration
   2.2 Operation
[3. Laser Apparatus Including Master Oscillator and Laser Amplifier]
   3.1 Configuration
   3.2 Operation
   3.3 Issues
[4. Laser Amplifier Including Mirror Provided with Wavelength Selective Film] (First Embodiment)
   4.1 Configuration
      4.1.1 Configuration of laser amplifier (slab amplifier)
      4.1.2 Configuration of mirror
      4.1.3 Material of wavelength selective film and base material of mirror
   4.2 Operation
   4.3 Action
   4.4 Combination example of spectral reflectance characteristics
[5. Laser Amplifier Including Window Provided with Wavelength Selective Film] (Second Embodiment)
[6. Modification of Laser Amplifier] (Third Embodiment)
   6.1 Slab amplifier in which laser optical paths do not intersect
   6.2 Coaxial slab amplifier
   6.3 High-speed axial-flow amplifier
   6.4 Combination example of spectral reflectance characteristics of wavelength selective films applicable to laser amplifier including three or more mirrors
   6.5 Three-axis orthogonal amplifier
   6.6 Regenerative amplifier
      6.6.1 Configuration
      6.6.2 Operation
      6.6.3 Effects
[7. Others]

In the following, some example embodiments of the disclosure are described in detail with reference to the drawings. Example embodiments described below each illustrate one example of the disclosure and are not intended to limit the contents of the disclosure. Also, all of the configurations and operations described in each example embodiment are not necessarily essential for the configurations and operations of the disclosure. Note that the like elements are denoted with the same reference numerals, and any redundant description thereof is omitted.

[1. Outline]

One example embodiment of the disclosure may relate to a laser amplifier configuring a laser apparatus used in an EUV light generating apparatus that applies laser light to a target to generate EUV light. One example embodiment of the disclosure may further relate to a laser amplifier including an optical device provided with a wavelength selective film that suppresses propagation of light of one or more wavelengths.

[2. Overall Description of EUV Light Generating System]

[2.1 Configuration]

FIG. 1 schematically illustrates a configuration of an exemplary LPP EUV light generating system. An EUV light generating apparatus 1 may be used together with one or more laser apparatuses 3. In some embodiments of the present application, a system including the EUV light generating apparatus 1 and the laser apparatus 3 is referred to as an EUV light generating system 11. As illustrated in FIG. 1 and as described in detail below, the EUV light generating apparatus 1 may include a chamber 2 and, for example, a target feeder 26 serving as a target feeder. The chamber 2 may be sealable. The target feeder 26 may be so attached as to penetrate a wall of the chamber 2, for example. A material of a target substance to be fed from the target feeder 26 may be tin, terbium, gadolinium, lithium, xenon, or any combination of two or more thereof without limitation.

One or more through holes may be provided on the wall of the chamber 2. The through hole may be provided with a window 21. Pulsed laser light 32 outputted from the laser apparatus 3 may pass through the window 21. For example, an EUV light concentrating mirror 23 including a spheroidal reflection surface may be disposed inside the chamber 2. The EUV light concentrating mirror 23 may include a first focal point and a second focal point. A multilayer reflection film in which, for example, molybdenum and silicon are alternately stacked may be provided on a surface of the EUV light concentrating mirror 23. The EUV light concentrating mirror 23 may be preferably disposed in such a manner that, for example, the first focal point is located in a plasma generation region 25 or in the vicinity of the plasma generation region 25 and the second focal point is located at an intermediate focus point (IF) 292 that is a desired light concentration position defined by specifications of an exposure unit 6. A through hole 24 may be provided at a center part of the EUV light concentrating mirror 23, and pulsed laser light 33 may pass through the through hole 24.

The EUV light generating apparatus 1 may include an EUV light generation controller 5. The EUV light generation controller 5 may include a target sensor 4, etc. The target sensor 4 may detect one or more of presence, trajectory, position, and speed of a target 27. The target sensor 4 may include an image pickup function.

The EUV light generating apparatus 1 may further include a connection section 29 that allows the inside of the chamber 2 to be in communication with the inside of the exposure unit 6. A wall 291 provided with an aperture 293 may be provided inside the connection section 29. The wall 291 may be disposed so that the aperture 293 is located at the second focal point of the EUV light concentrating mirror 23.

The EUV light generating apparatus 1 may include a laser light traveling direction control section 34, a laser light concentrating mirror 22, a target collector 28, etc. The target collector 28 may collect the target 27. The laser light traveling direction control section 34 may include, in order to control a traveling direction of the laser light, an optical device that defines the traveling direction of the laser light and an actuator that adjusts position, attitude, etc., of the optical device.

[2.2 Operation]

Referring to FIG. 1, the pulsed laser light 31 outputted from the laser apparatus 3 may travel through the laser light traveling direction control section 34, and the pulsed laser light 31 that has passed through the laser light traveling direction control section 34 may enter, as the pulsed laser light 32, the chamber 2 after passing through the window 21. The pulsed laser light 32 may travel inside the chamber 2 along one or more laser light paths, and then may be reflected by the laser light concentrating mirror 22. The pulsed laser light 32 reflected by the laser light concentrating mirror 22 may be applied, as the pulsed laser light 33, to one or more targets 27.

The target feeder 26 may be adapted to output the target 27 to the plasma generation region 25 inside the chamber 2. The target 27 may be irradiated with one or more pulses included in the pulsed laser light 33. The target 27 irradiated with the pulsed laser light may turn into plasma, and EUV light 251 may be radiated together with radiation light from the plasma. The EUV light 251 may be reflected and concentrated by the EUV light concentrating mirror 23. EUV light 252 reflected by the EUV light concentrating mirror 23 may be outputted to the exposure unit 6 through the intermediate focus point 292. Note that a plurality of pulses included in the pulsed laser light 33 may be applied to one target 27.

The EUV light generation controller 5 may be adapted to manage control of the entire EUV light generating system 11. The EUV light generation controller 5 may be adapted to process, for example, data of an image of the target 27 picked up by the target sensor 4. For example, the EUV light generating controller 5 may be adapted to control one or both of control of output timing of the target 27 and control of an output direction of the target 27.

For example, the EUV light generation controller 5 may be adapted to control one or more of oscillation timing of the laser apparatus 3, the traveling direction of the pulsed laser light 32, and a concentration position of the pulsed laser light 33. The above-described various controls are illustrative, and other control may be added as necessary.

[3. Laser Apparatus Including Master Oscillator and Laser Amplifier]

[3.1 Configuration]

Figure 2:
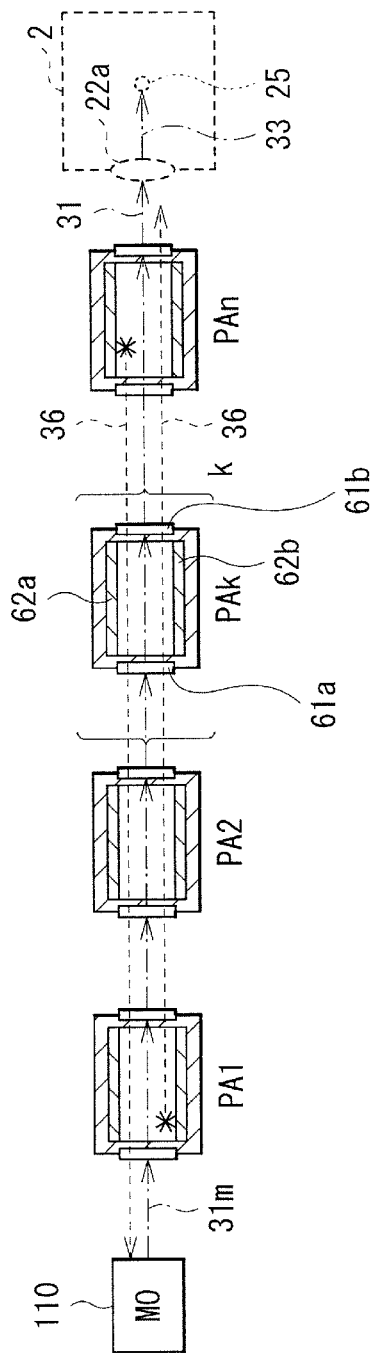
FIG. 2 schematically illustrates a configuration example of a laser apparatus including a master oscillator and laser amplifiers.

With reference to FIG. 2, a configuration example of the laser apparatus 3 used in the LPP EUV light generating apparatus is described. In the LPP EUV light generating apparatus, the laser apparatus 3 to be used may include a $CO_2$ laser apparatus. The $CO_2$ laser apparatus used as the laser apparatus 3 may be required to output pulsed laser light with high pulse energy at high repetition frequency. Therefore, the laser apparatus 3 may include a master oscillator (MO) 110 and one or more laser amplifiers. The master oscillator 110 may output pulsed laser light $31m$ at high repetition frequency. The one or more laser amplifiers may amplify the pulsed laser light $31m$. For example, as illustrated in FIG. 2, the laser apparatus 3 may include a plurality of amplifiers PA1, PA2, . . . , PAk, . . . , PAn as the laser amplifiers.

The master oscillator 110 may be a $CO_2$ laser including a Q switch or a quantum-cascade laser (QCL) oscillating in an amplification wavelength range of $CO_2$ laser. Each of the plurality of amplifiers PA1, PA2, . . . , PAk, . . . , PAn may be a laser amplifier using $CO_2$ laser gas as a laser medium. Each of the plurality of amplifiers PA1, PA2, PAk, . . . , PAn may include a pair of electrodes $62a$ and $62b$ disposed in the chamber that contains the $CO_2$ laser gas. Each of the plurality of amplifiers may include an input window $61a$ and an output window $61b$. The input window $61a$ may allow the pulsed laser light from the outside to enter the chamber. The output window $61b$ may allow the amplified pulsed laser light to be outputted to the outside of the chamber. The amplifiers PA1, PA2, PAk, . . . , PAn may be disposed in series on an optical path of the pulsed laser light $31m$ outputted from the master oscillator 110.

[3.2 Operation]

The plurality of amplifiers PA1, PA2, ..., PAk, ..., PAn may apply a voltage between the corresponding pair of electrodes 62a and 62b with use of respective unillustrated power sources to perform electric discharge. The Q switch of the master oscillator 110 may be operated at the predetermined repetition frequency. As a result, the pulsed laser light 31m may be outputted from the master oscillator 110 at the predetermined repetition frequency.

Even when not receiving the pulsed laser light 31m outputted from the master oscillator 110, each of the plurality of amplifiers PA1, PA2, ..., PAk, ..., PAn may generate electric discharge, by means of unillustrated power sources, to excite the laser medium. The pulsed laser light 31m outputted from the master oscillator 110 may enter, as seed light, the first amplifier PA1, and may be amplified by passing through the first amplifier PA1. The amplified pulsed laser light may be then outputted from the first amplifier PA1. The pulsed laser light that has been amplified by and outputted from the first amplifier PA1 may enter, as seed light, the second amplifier PA2, and may be further amplified by passing through the second amplifier PA2. Then, the further amplified pulsed laser light may be outputted from the second amplifier PA2. Likewise, pulsed laser light that has been outputted from the k−1-th amplifier PAk−1 may enter, as seed light, the k-th amplifier PAk, and may be further amplified by passing through the k-th amplifier PAk. Then, the amplified pulsed laser light may be outputted from the k-th amplifier PAk. The pulsed laser light that has been outputted from the n−1-th amplifier PAn−1 may enter, as seed light, the n-th amplifier PAn, and may be further amplified by passing through the n-th amplifier PAn. The amplified pulsed laser light may be then outputted from the n-th amplifier PAn.

The pulsed laser light 31 outputted from the n-th amplifier PAn may enter the chamber 2 as the plasma chamber in the EUV light generating apparatus 1 illustrated in FIG. 1, and the pulsed laser light having entered the chamber 2 may be concentrated on the plasma generating region 25 by a laser light concentrating optical system 22a, thereby becoming pulsed laser light 33. The pulsed laser light 33 concentrated on the plasma generating region 25 may be applied to the target 27 in the plasma generating region 25. The target 27 irradiated with the concentrated pulsed laser light 33 may turn into plasma, and EUV light may be radiated from the plasma. Note that the laser light concentrating optical system 22a may include one or a plurality of reflective optical devices each corresponding to the laser light concentrating mirror 22 illustrated in FIG. 1 or may be a refractive optical system including a lens.

[3.3 Issues]

The $CO_2$ laser apparatus including the combination of the master oscillator and one or more laser amplifiers may perform self oscillation by amplified spontaneous emission (ASE) light 36 outputted from the one or more laser amplifiers, irrespective of the pulsed laser light 31m outputted from the master oscillator 110. The inventors of the present application found that the ASE light 36 with the wavelength of 9.27 μm, the wavelength of 9.59 μm, and the wavelength of 10.24 μm may be outputted as such self-oscillation light, in addition to the light with the wavelength of 10.59 μm that is to be seed light. When the ASE light 36 other than the seed light enters another laser amplifier, the laser amplifier having received the ASE light 36 may amplify the received ASE light 36 other than the seed light. As a result, an amplification factor for amplification of the seed light may be degraded. Therefore, it is desirable to suppress self-oscillation by the ASE light 36 with the wavelength of 9.27 μm, the wavelength of 9.59 μm, and the wavelength of 10.24 μm. Note that the seed light may refer to laser light to be amplified by the laser amplifier. For example, in FIG. 2, in the first amplifier PA1, the pulsed laser light 31m outputted from the master oscillator 110 may serve as the seed light. In the second amplifier PA2, the pulsed laser light that has been amplified by and outputted from the first amplifier PA1 may serve as the seed light.

Figure 3:
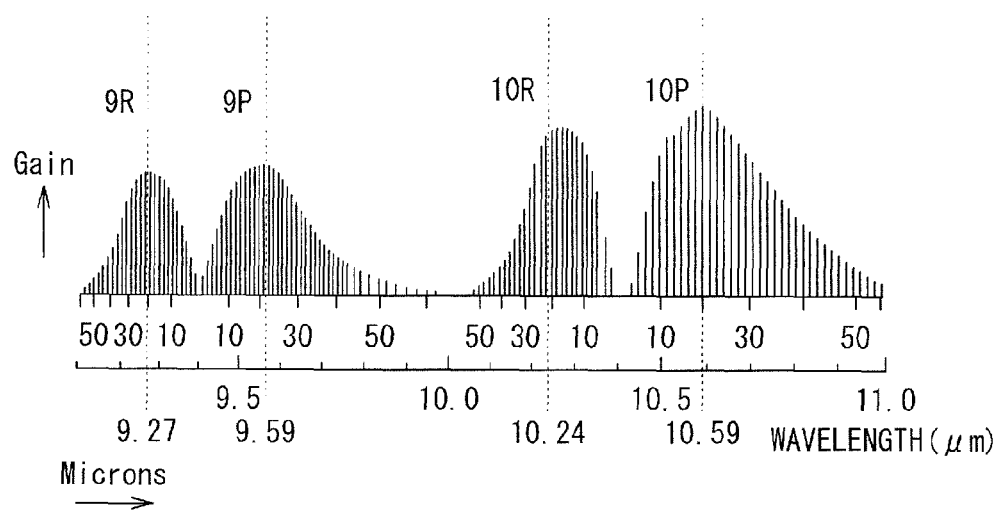
FIG. 3 illustrates relationship between an amplification line and a gain in a case where $CO_2$ laser gas is used as a laser medium.

As illustrated in FIG. 2, for example, the ASE light 36 generated in the n-th amplifier PAn may travel along a direction toward the master oscillator 110, and be amplified by the plurality of amplifiers PA1, PA2, ..., PAk, ..., PAn−1, which may result in self-oscillation light. The ASE light 36 generated in the first amplifier PA1 may travel along a direction toward the chamber 2, and be amplified by the plurality of amplifiers PA2, ..., PAk, ..., PAn, thereby becoming self-oscillation light. In this way, the ASE light 36 generated by a certain laser amplifier may be amplified by another laser amplifier to be self-oscillation light. The inventors of the present application found that, when the $CO_2$ laser gas was used as a gain medium, self-oscillation may occur in four wavelength ranges as illustrated in Table 1 and FIG. 3. FIG. 3 illustrates relationship between an amplification line and a gain when the $CO_2$ laser gas is used as the gain medium.

TABLE 1

| Gain Line | 9R(20) | 9P(24) | 10R(20) | 10P(20) |
|---|---|---|---|---|
| Wavelength of Outputted Laser Light (μm) | 9.27 | 9.59 | 10.24 | 10.59 |

More specifically, the inventors of the present application found that, when the $CO_2$ laser gas was used as the gain medium, self-oscillation may occur in the wavelength bands of 9.27 μm (9R), 9.59 μm (9P), 10.24 μm (10R), and 10.59 μm (10P). In these wavelength bands, the gain may be large, and self-oscillation may easily occur by the plurality of amplifiers PA1, PA2, ..., PAk, ..., PAn. Among the wavelength bands, the ASE light 36, in the wavelength bands of 9.27 μm, 9.59 μm, and 10.24 μm excluding the wavelength band of 10.59 μm serving as the seed light, may deteriorate output of the pulsed laser light 31 outputted from the laser apparatus 3 or may adversely affect the pulsed waveform of the pulsed laser light 31. As result, the output of the EUV light may be degraded.

Figure 4:
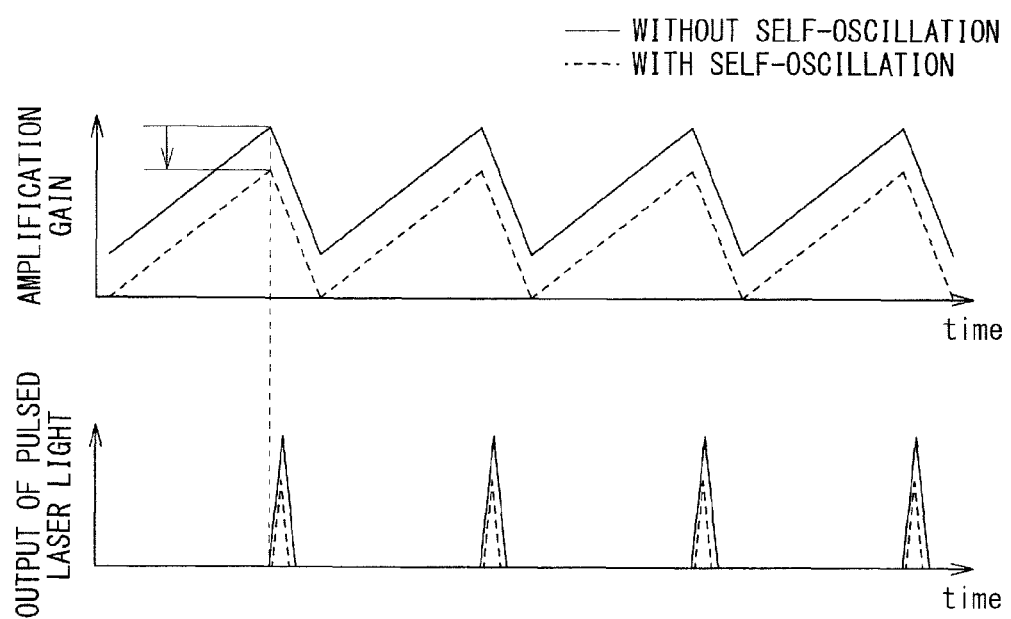
FIG. 4 illustrates an example of an amplification gain and degradation in output of the pulsed laser light depending on self-oscillation.

An upper diagram of FIG. 4 illustrates an example of variation of the amplification gain of the laser amplifier with time. A lower diagram of FIG. 4 illustrates an example of output variation of the pulsed laser light of the laser amplifier with time. FIG. 4 illustrates the variation in an amplification gain with time and the output variation of the pulsed laser light with time each compared between in the case with self-oscillation and in the case without self-oscillation. As illustrated in FIG. 4, the self-oscillation may consume the amplification gain of the laser amplifier to cause degradation in amplification factor, thereby degrading the output of the pulsed laser light. Further, when the self-oscillation light enters the master oscillator 110, optical components of the master oscillator 110 may be damaged by the self-oscillation light.

[4. Laser Amplifier Including Mirror Provided with Wavelength]Selective Film (First Embodiment)

[4.1 Configuration]

[4.1.1 Configuration of Laser Amplifier (Slab Amplifier)]

Figure 5:
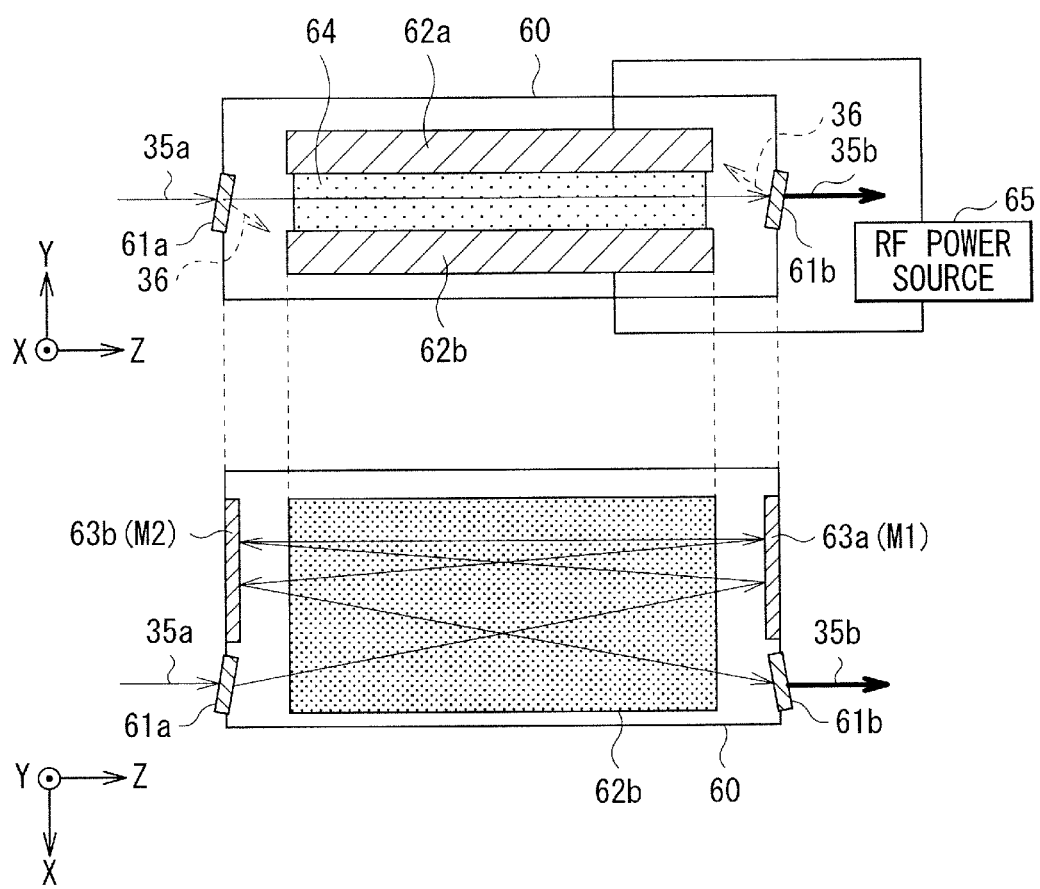
FIG. 5 schematically illustrates a configuration example of a laser amplifier in which a mirror is provided with a wavelength selective film.

With reference to FIG. 5, a configuration of a laser amplifier according to a first embodiment of the disclosure is described. FIG. 5 illustrates a configuration example of a slab amplifier as an example of the laser amplifier. In FIG. 5, an upper diagram illustrates a sectional configuration of the laser amplifier as viewed from a side surface direction, and a lower diagram illustrates a sectional configuration of the laser amplifier as viewed from a top surface direction. The slab amplifier illustrated in FIG. 5 may be applied to one or more of the plurality of amplifiers PA1, PA2, . . . , PAk, . . . , PAn in FIG. 2.

The slab amplifier may include an amplification chamber 60, the input window 61a, the output window 61b, the pair of electrodes 62a and 62b, a first mirror 63a, a second mirror 63b, and an RF (radiofrequency) power source 65.

The amplification chamber 60 may contain the $CO_2$ laser gas therein as the laser medium. The pair of electrodes 62a and 62b and the RF power source 65 may configure an excitation unit that excites the laser medium to amplify the seed light 35a that has entered the amplification chamber 60. The pair of electrodes 62a and 62b may be disposed inside the amplification chamber 60, and may excite the laser medium in an electric discharge region 64 by electric discharge. The RF power source 65 may supply an RF voltage to the pair of electrodes 62a and 62b. The laser medium excited by the excitation unit may be able to amplify light of a desired wavelength as well as light of one or more suppression target wavelengths. The light of the desired wavelength may be the seed light 35a. The light of the suppression target wavelength may be the ASE light 36 of the wavelength other than the wavelength of the seed light. The light of the suppression target wavelengths may also be the self-oscillation light by the ASE light 36.

The input window 61a may be a first window that is provided on a wall of the amplification chamber 60 and allows the seed light 35a serving as the input laser light to enter the amplification chamber 60. The output window 61b may be a second window that is provided on a wall of the amplification chamber 60 and outputs, as the amplified laser light 35b to the outside of the amplification chamber 60, the laser light amplified by the excitation unit.

The first mirror 63a and the second mirror 63b may be disposed on the laser optical path between the input window 61a and the output window 61b, and may reflect the laser light inside the amplification chamber 60. The first mirror 63a and the second mirror 63b each may be a flat mirror or a concave mirror, and preferably a cylindrical concave mirror. One or both of the first mirror 63a and the second mirror 63b may be provided with a wavelength selective film that suppresses propagation of light of one or more suppression target wavelengths that is different from the desired wavelength.

[4.1.2 Configuration of Mirror]

In an example case where the wavelength selective film is provided in each of the first mirror 63a and the second mirror 63b, the wavelength selective films may be different in wavelength selection property from each other. Each of the wavelength selective films may exhibit high reflectivity to light of a desired wavelength as compared with light of a suppression target wavelengths. Also, each of the wavelength selective films may exhibit low reflectivity to light of wavelengths other than the desired wavelength.

Figure 6:
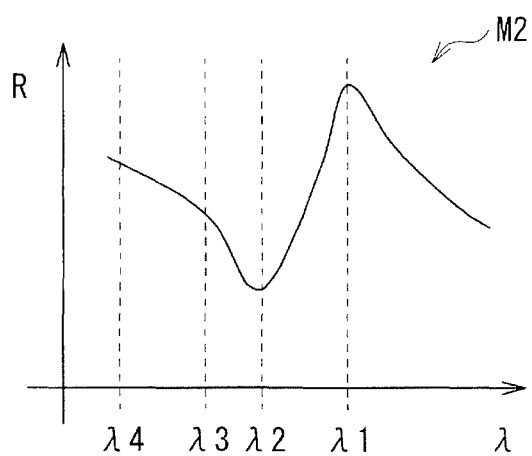
FIG. 6 illustrates an example of spectral reflectance characteristics of a wavelength selective film that is provided on a second mirror.

For example, in the case where the desired wavelength is denoted by $\lambda 1$, spectral reflectance characteristics M2 of the wavelength selective film provided on the second mirror 63b may be set to those illustrated in FIG. 6. A vertical axis in the spectral reflectance characteristics of FIG. 6 indicates a reflectance R, and a horizontal axis $\lambda$ indicates a wavelength. The same may apply to a vertical axis and a horizontal axis in the other spectral reflectance characteristics in the following description. Spectral reflectance characteristics M1 of the wavelength selective film provided on the first mirror 63a may be set to those illustrated in FIG. 7. The wavelength $\lambda 1$ may be 10.59 μm. A wavelength $\lambda 2$ may be 10.24 μm. A wavelength $\lambda 3$ may be 9.59 μm. A wavelength $\lambda 4$ may be 9.27 μm. In the laser amplifier, providing the wavelength selective film on the mirror may increase loss by the reflection of the laser light of the wavelengths other than the desired wavelength, thereby suppressing self-oscillation by the laser light of the wavelengths other than the desired wavelength.

[4.1.3 Material of Wavelength Selective Film and Base Material of Mirror]

Figure 8:
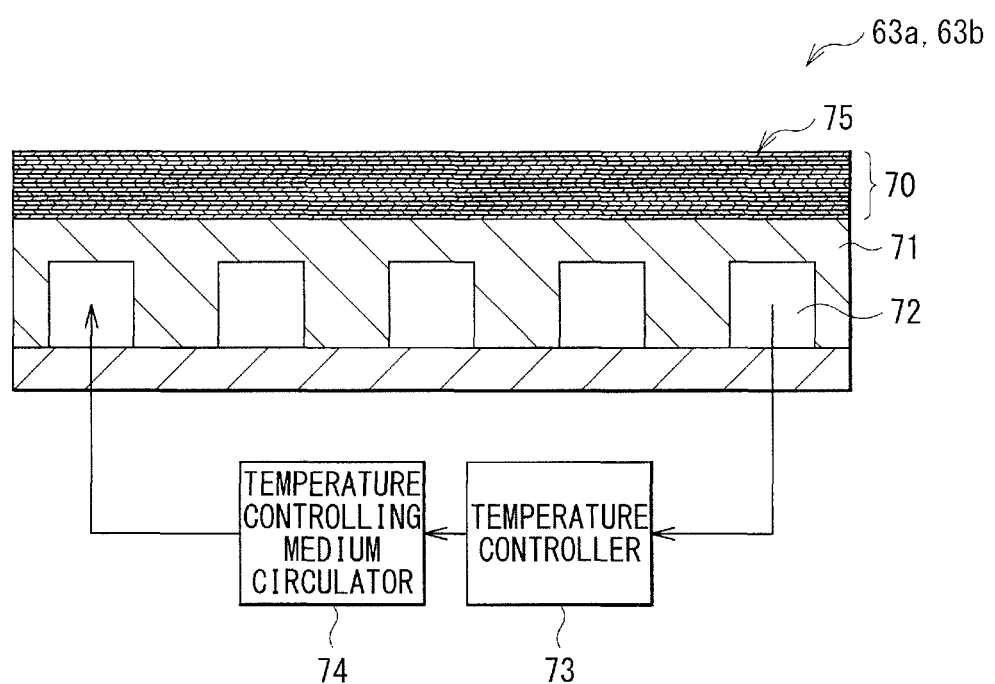
FIG. 8 schematically illustrates a configuration example of a mirror provided with a wavelength selective film.

FIG. 8 illustrates a configuration example of the first mirror 63a or the second mirror 63b provided with the wavelength selective film. As illustrated in FIG. 8, a substrate 71 may be coated with a wavelength selective film 70 to serve a surface of the wavelength selective film 70 as a reflection surface 75.

The wavelength selective film 70 may include a coating film in which two kinds of materials with different refractive indices from each other are alternately stacked. The wavelength selective film 70 may be a film in which a high refractive-index material and a low refractive-index material are alternately stacked. Non-limiting examples of the high refractive-index material may include ZnSe and ZnS. Non-limiting examples of the low refractive-index material may include $ThF_4$ and $PbF_2$. Controlling a film thickness of each of the high refractive-index material and a low refractive-index material may achieve desired spectral reflectance characteristics.

Non-limiting examples of the material of the substrate 71 may include Si, GaAs, ZnSe, and diamond. The substrate 71 may include a temperature controlling mechanism. The temperature controlling mechanism may be a combination of a temperature controlling medium path 72, a temperature controller 73, and a temperature controlling medium circulator 74. The temperature controlling medium path may be provided with the substrate 71. The laser light of a part of the wavelengths that has passed through the wavelength selective film 70 and then reached the substrate 71 may heat the substrate 71. The temperature controlling mechanism may discharge the heat to prevent the substrate 71 from overheating.

[4.2 Operation]

Figure 7:
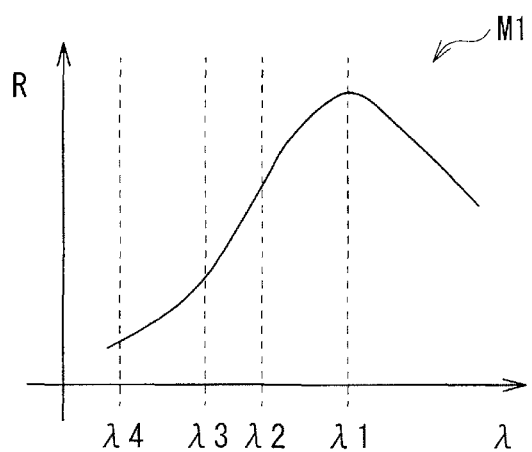
FIG. 7 illustrates an example of spectral reflectance characteristics of a wavelength selective film that is provided on a first mirror.

In a state where the RF voltage is supplied from the RF power source 65 to the pair of electrodes 62a and 62b, the laser light that is to be the seed light 35a may enter the amplification chamber 60 through the input window 61a. The entered laser light may pass through the laser medium excited between the pair of electrodes 62a and 62b while being reflected by the first mirror 63a and the second mirror 63b in the amplification chamber 60, thereby being amplified. The amplified laser light may be outputted as amplified laser light 35b through the output window 61b. The laser light may be reflected between the first mirror 63a and the second mirror 63b multiple times. At this time, since the wavelength selective films involving the respective spectral reflectance characteristics M1 and M2 as illustrated in FIG. 6 and FIG. 7 are provided, the laser light of the wavelengths other than the desired wavelength that is reflected by the first mirror 63a and the second mirror 63b may be large in reflection loss. This may allow for suppression of amplification. As a result, the laser light of the desired wavelength may be amplified, whereas the self-oscillation by the light of the wavelengths other than the desired wavelength may be suppressed.

[4.3 Action]

According to the first embodiment, the self-oscillation by the light of the wavelengths other than the wavelength desired to be amplified may be suppressed. Thus, the amplification factor of the laser amplifier may not be degraded, which may make it possible to amplify the laser light with high amplification efficiency. In the laser apparatus application illustrated in FIG. 2, the optical components of the master oscillator 110 may be less damaged by the self-oscillated light. As a result, it is possible to suppress variation of the laser output to perform stable amplification operation.

[Example of Combination of Spectral Reflectance Characteristics]

Figure 9:
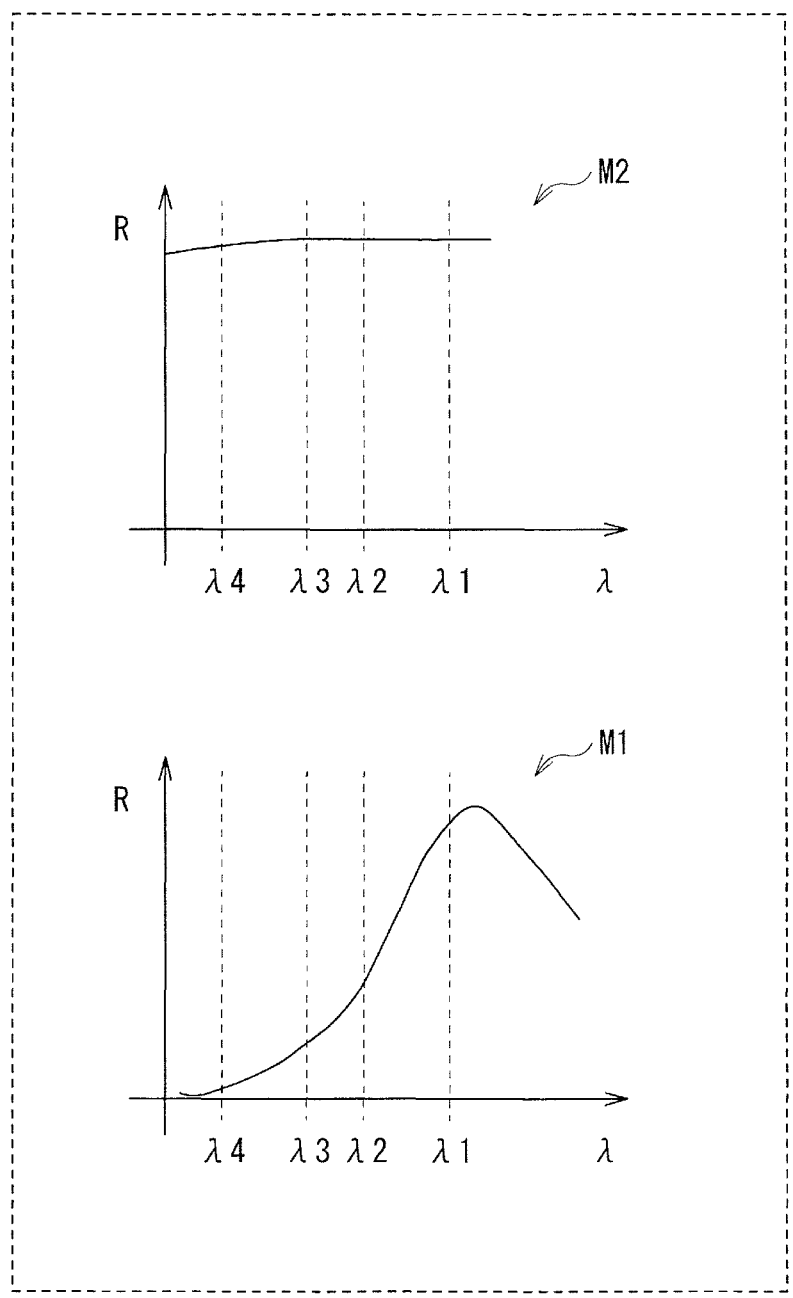
FIG. 9 illustrates a first combination example of spectral reflectance characteristics applicable as the wavelength selective films of the first and the second mirrors.
Figure 10:
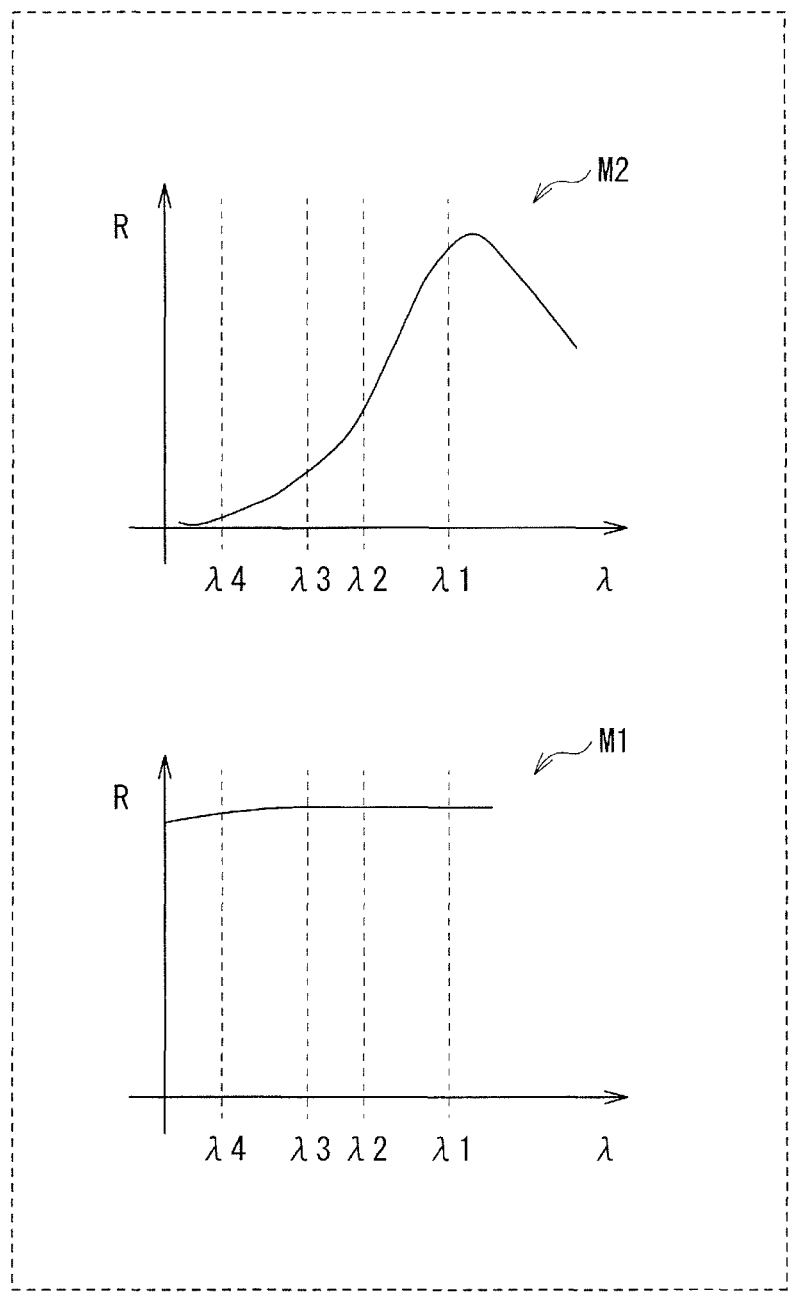
FIG. 10 illustrates a second combination example of the spectral reflectance characteristics applicable as the wavelength selective films of the first and the second mirrors.

FIG. 9 illustrates a first combination example of the spectral reflectance characteristics M1 and M2 applicable as the wavelength selective films of the first mirror 63a and the second mirror 63b. FIG. 10 illustrates a second combination example of the spectral reflectance characteristics M1 and M2 applicable as the wavelength selective films of the first mirror 63a and the second mirror 63b. One of the spectral reflectance characteristics M1 of the wavelength selective film of the first mirror 63a and the spectral reflectance characteristics M2 of the wavelength selective film of the second mirror 63b may include reflectance characteristics in which the reflectance at the desired wavelength is higher than the reflectance at any other wavelength. For example, as illustrated in FIG. 9, the spectral reflectance characteristics M1 of the wavelength selective film of the first mirror 63a may be set to reflectance characteristics in which the reflectance at the desired wavelength λ1 is higher than the reflectance at any other wavelength. For example, as illustrated in FIG. 10, the spectral reflectance characteristics M2 of the wavelength selective film of the second mirror 63b may be set to reflectance characteristics in which the reflectance at the desired wavelength λ1 is higher than the reflectance at any other wavelength.

Figure 11:
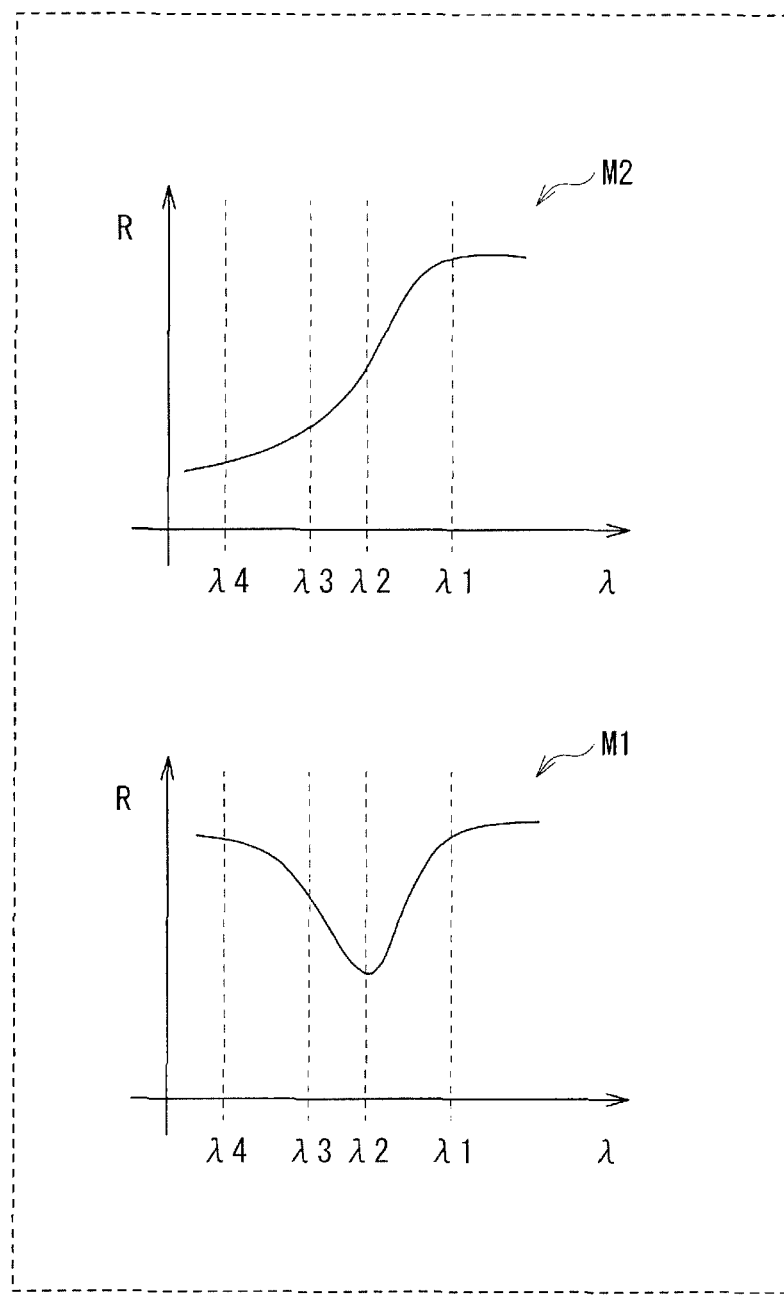
FIG. 11 illustrates a third combination example of the spectral reflectance characteristics applicable as the wavelength selective films of the first and the second mirrors.

FIG. 11 illustrates a third combination example of the spectral reflectance characteristics M1 and M2 applicable as the wavelength selective films of the first mirror 63a and the second mirror 63b. For example, as illustrated in FIG. 11, the reflectance characteristics may be set to be high in only the reflectance at the desired wavelength λ1 by using the combination of the spectral reflectance characteristics M1 and M2 of the wavelength selective films of the first mirror 63a and the second mirror 63b. Such setting may enhance loss at the other wavelengths to suppress self-oscillation.

Figure 12:
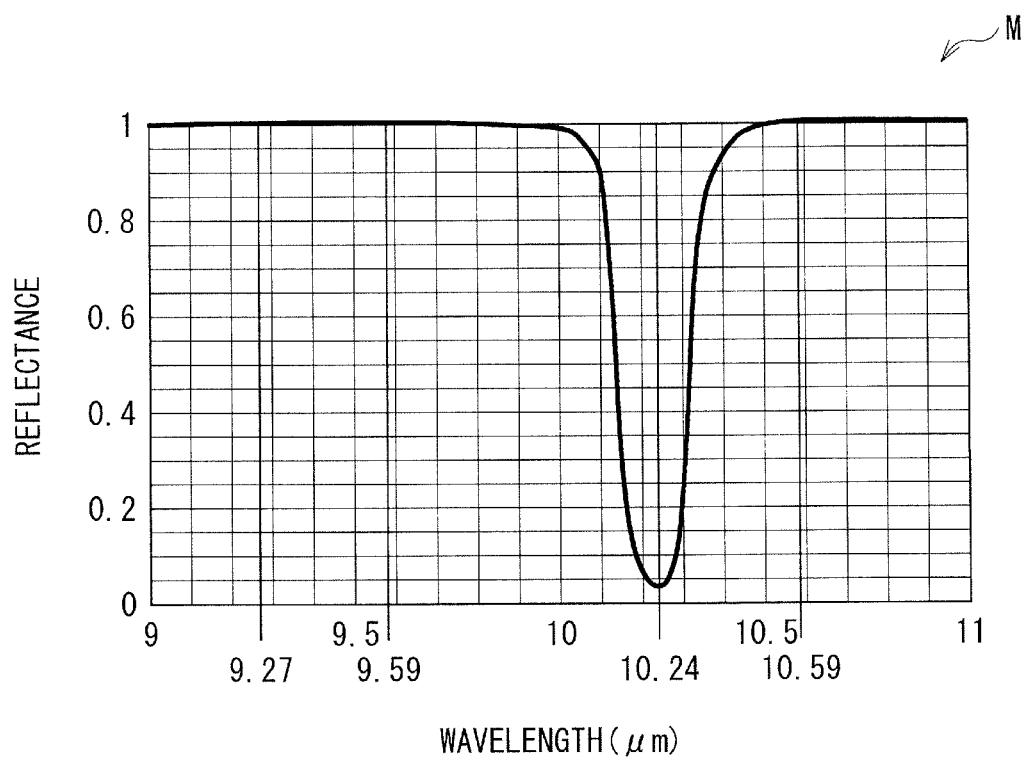
FIG. 12 illustrates a specific but non-limiting example of spectral reflectance characteristics available as the wavelength selective film of the first mirror.
Figure 13:
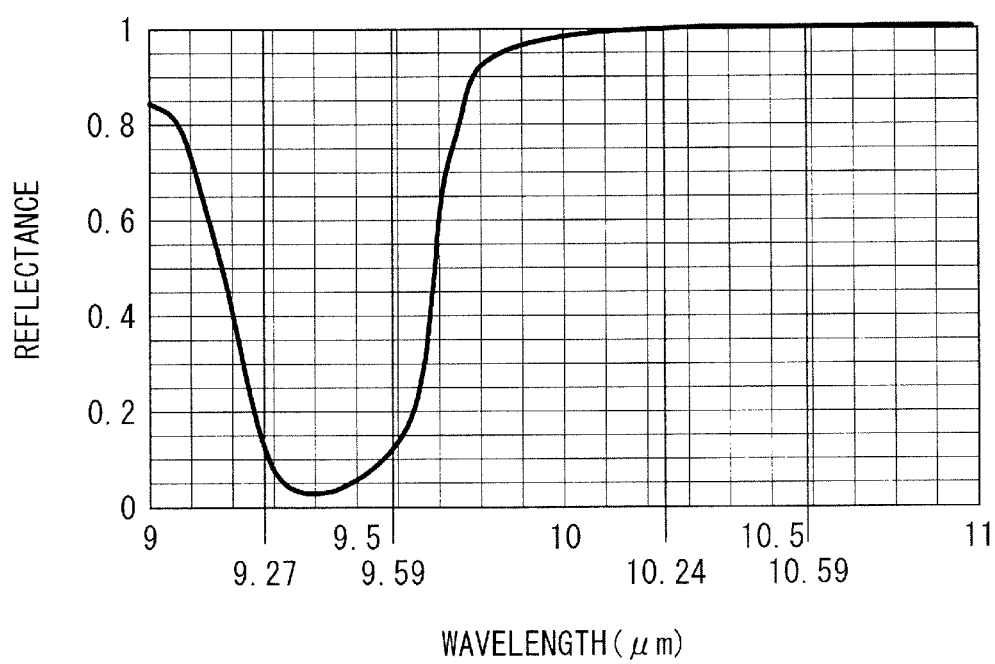
FIG. 13 illustrates a specific but non-limiting example of spectral reflectance characteristics available as the wavelength selective film of the second mirror.

FIG. 12 illustrates a specific but non-limiting example of the spectral reflectance characteristics M1 available as the wavelength selective film of the first mirror 63a. FIG. 13 illustrates a specific but non-limiting example of the spectral reflectance characteristics M2 available as the wavelength selective film of the second mirror 63b. The two kinds of wavelength selective films involving the respective spectral reflectance characteristics M1 and M2 that are different from each other as illustrated in FIG. 12 and FIG. 13 may be combined and used. The higher reflectance at the desired wavelength of 10.59 μm may be maintained while the reflectance at the other respective wavelengths of 9.27 μm, 9.59 μm, and 10.24 μm may be suppressed by using the two kinds of wavelength selective films.

[5. Laser Amplifier Including Window Provided with Wavelength Selective Film] (Second Embodiment)

Figure 14:
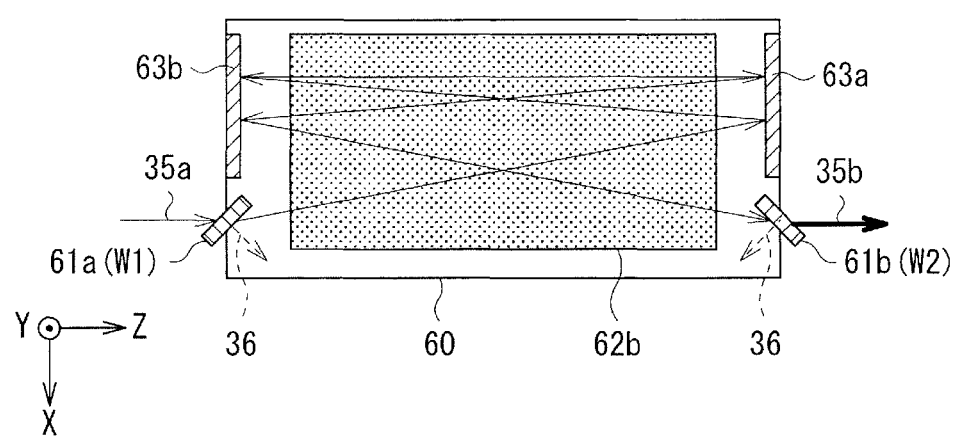
FIG. 14 schematically illustrates a configuration example of a laser amplifier in which a window is provided with a wavelength selective film.

With reference to FIG. 14, a configuration of a laser amplifier according to a second embodiment of the disclosure is described. The laser amplifier illustrated in FIG. 14 may include a configuration of the slab amplifier that is substantially similar to the configuration of the laser amplifier illustrated in FIG. 5 but is different in a part where the wavelength selective film is provided from the configuration of the laser amplifier illustrated in FIG. 5. The slab amplifier illustrated in FIG. 14 may be applied to one or more of the plurality of amplifiers PA1, PA2, . . . , PAk, . . . , PAn in FIG. 2.

As seen from the configuration example illustrated in FIG. 14, one or both of the input window 61a and the output window 61b may be provided with a wavelength selective film that suppresses propagation of light of one or more suppression target wavelengths that are different from the desired wavelength. Further, one or both of the first mirror 63a and the second mirror 63b may be provided with the wavelength selective film with combination of the configuration of the above-described first embodiment.

When the input window 61a and the output window 61b each are provided with the wavelength selective film, the wavelength selective films may be different in wavelength selection property from each other. The wavelength selective films each may possess low reflectance, namely, high transmittance with respect to the light of the desired wavelength as compared with the light of the suppression target wavelengths. Also, the reflectance at any other wavelength other than the desired wavelength may be set to be high, namely, transmittance at any other wavelength other than the desired wavelength may be set to be low.

Figure 15:
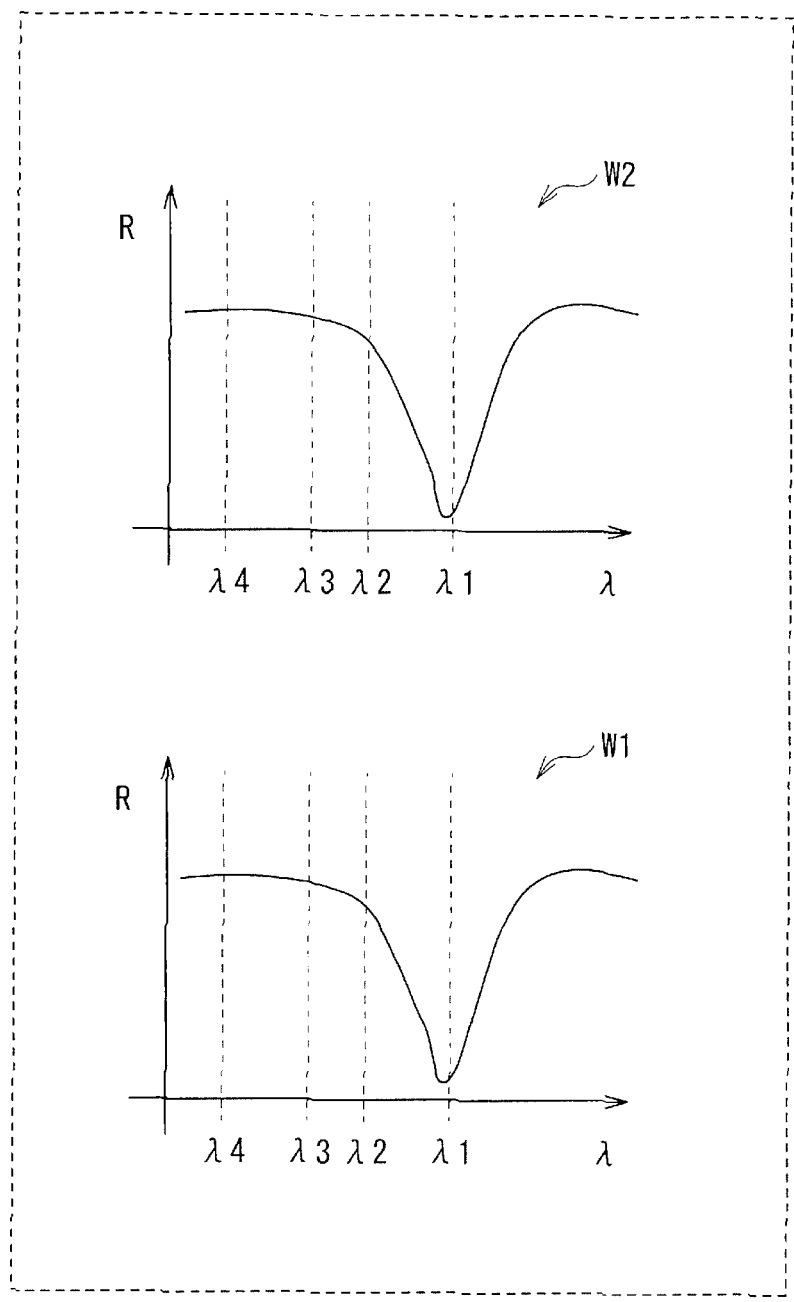
FIG. 15 illustrates a combination example of spectral reflectance characteristics applicable as wavelength selective films of first and second windows.

FIG. 15 illustrates a combination example of spectral reflectance characteristics W1 and W2 applicable as the wavelength selective films of the first window 61a and the second window 61b. As illustrated in FIG. 15, the spectral reflectance characteristics W1 of the wavelength selective film of the first window 61a may be substantially equivalent to the spectral reflectance characteristics W2 of the wavelength selective film of the second window 61b.

When the wavelength selective film is provided on each of the first and second windows 61a and 61b, the ASE light 36 or the self-oscillation light may be reflected at high reflectance by the wavelength selective film, which may result in unnecessary reflected light. To prevent the unnecessary reflected light from traveling to a clearance between the pair of electrodes 62a and 62b, the first and second windows 61a and 61b may be tilted as illustrated in FIG. 14. Further, the wavelength selective films of the first and second windows 61a and 61b each may serve as a thin film polarizer (TPP) to reflect light other than the light at the desired wavelength and the light other than the desired polarized light. This may suppress the self-oscillation light. A coating material configuring the wavelength selective film may be substantially similar to the coating material of the wavelength selective films provided on the first and second mirrors 63a and 63b. Non-limiting examples of the base material may include ZnSe and diamond that exhibit high transmittance with respect to the desired wavelength.

[6. Modification of Laser Amplifier] (Third Embodiment)

In the above-described first and second embodiments, the configuration example of the slab amplifier as the laser amplifier has been described; however, it may be possible to use a slab amplifier of a different type from that described above including a configuration in which the wavelength selective film is provided on a mirror or window. Alternatively, the laser amplifier may be a laser amplifier other than the slab amplifier, in which the wavelength selective film is provided on a mirror or window. Even in the case of any type, the wavelength selective film may be provided on both of a mirror and a window.

[6.1 Slab Amplifier in which Laser Optical Paths Do Not Intersect]

Figure 16:
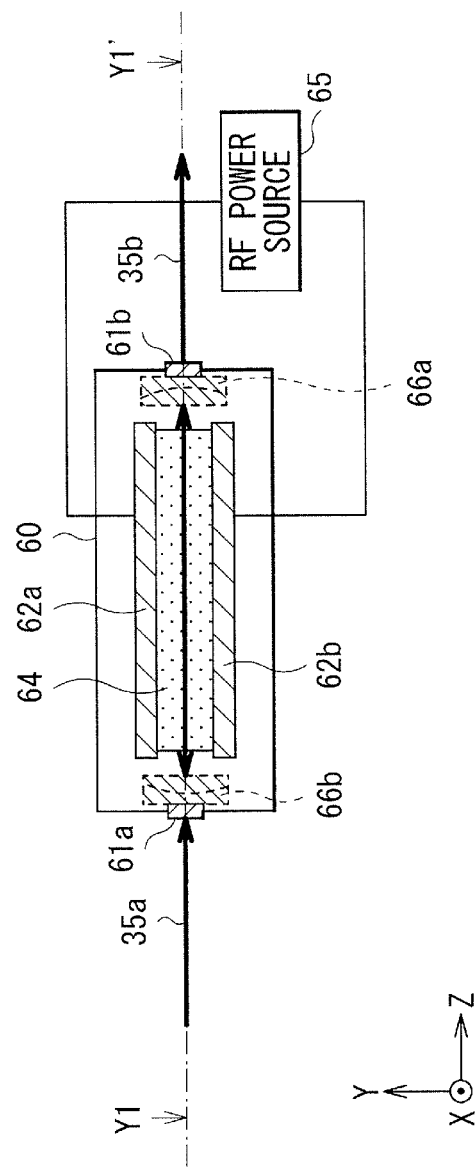
FIG. 16 schematically illustrates a configuration example of a slab amplifier in which laser optical paths do not intersect.
Figure 17:
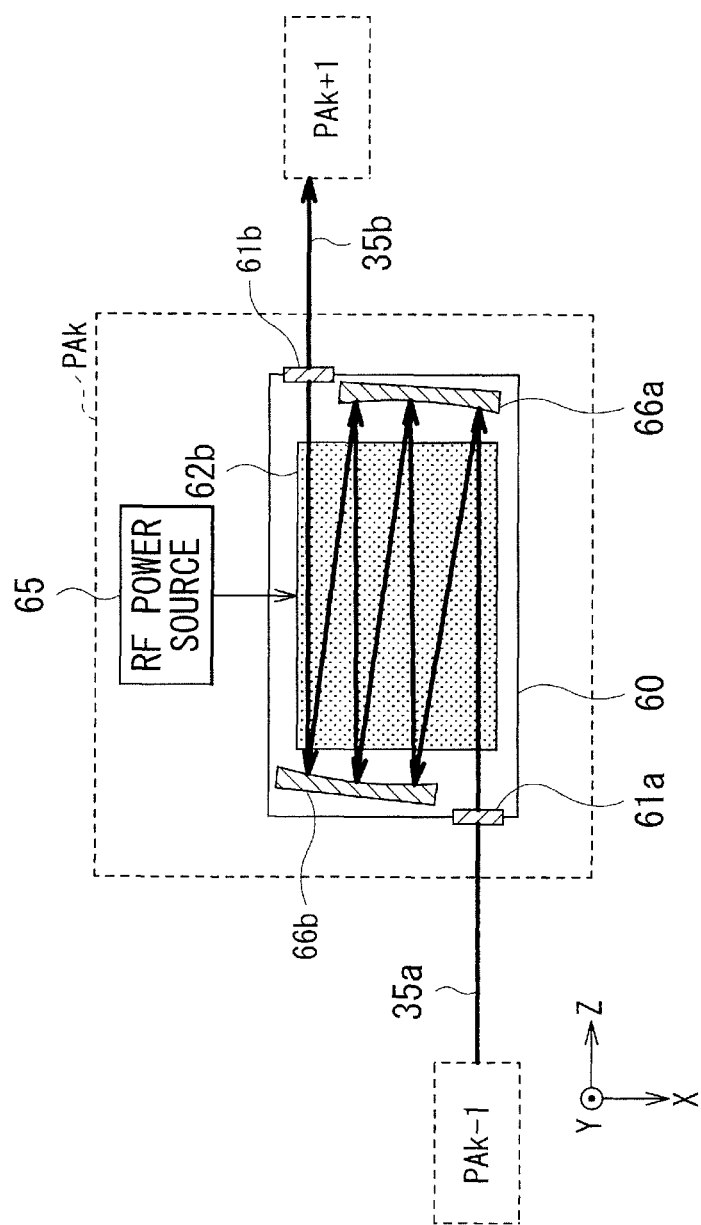
FIG. 17 schematically illustrates a configuration example of the slab amplifier illustrated in FIG. 16 as viewed from a direction of a line Y1-Y1'.

FIG. 16 and FIG. 17 each illustrate a configuration example of a slab amplifier of a different type from the slab amplifier in the above-described first and second embodiments. FIG. 16 illustrates a sectional configuration of the slab amplifier as viewed from a side surface direction, and FIG. 17 illustrates a sectional configuration of the slab amplifier illustrated in FIG. 16 as viewed from a line Y1-Y1' direction. The slab amplifier illustrated in FIG. 16 and FIG. 17 may be applied to one or more of the plurality of amplifiers PA1, PA2, . . . , PAk, . . . , PAn. FIG. 17 illustrates an example in which the slab amplifier is applied to the k-th amplifier PAk.

The slab amplifier illustrated in FIG. 16 and FIG. 17 may include a first concave mirror 66a in place of the first mirror 63a in FIG. 5, for example. The slab amplifier illustrated in FIG. 16 and FIG. 17 may include a second concave mirror 66b in place of the second mirror 63b in FIG. 5. As illustrated in FIG. 17, the first concave mirror 66a and the second concave mirror 66b may be so disposed as not to allow the laser light to intersect on the laser optical path between the input window 61a and the output window 61b. Thus, the laser light may be reflected by the first concave mirror 66a and the second concave mirror 66b multiple times. The first concave mirror 66a and the second concave mirror 66b each may be a flat mirror, and may preferably be a cylindrical concave mirror.

In such a slab amplifier in which the laser optical paths do not intersect, one or both of the first concave mirror 66a and the second concave mirror 66b may be provided with the wavelength selective films similar to those in the above-described first embodiment. Alternatively, one or both of the input window 61a and the output window 61b may be provided with the wavelength section films similar to those in the above-described second embodiment.

[6.2 Coaxial Slab Amplifier]

Figure 18:
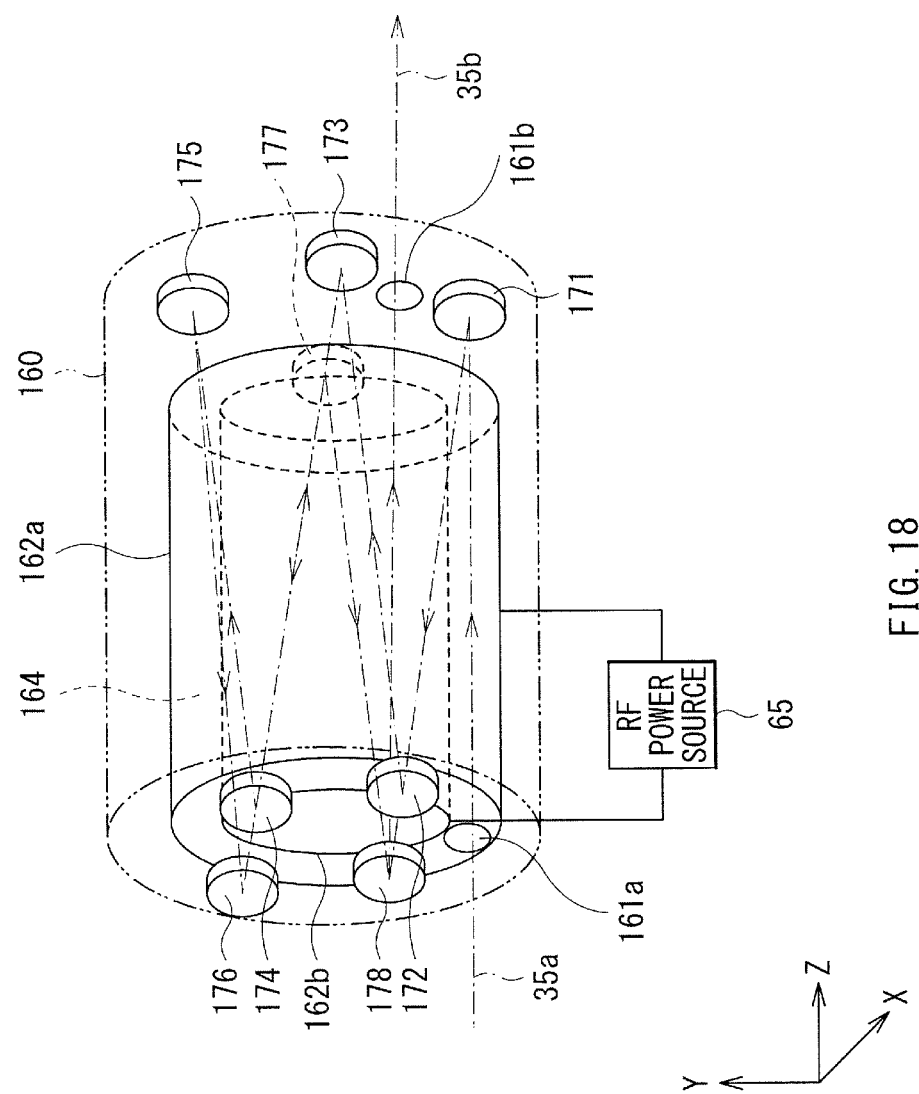
FIG. 18 schematically illustrates an example of an entire configuration of a coaxial slab amplifier.
Figure 19:
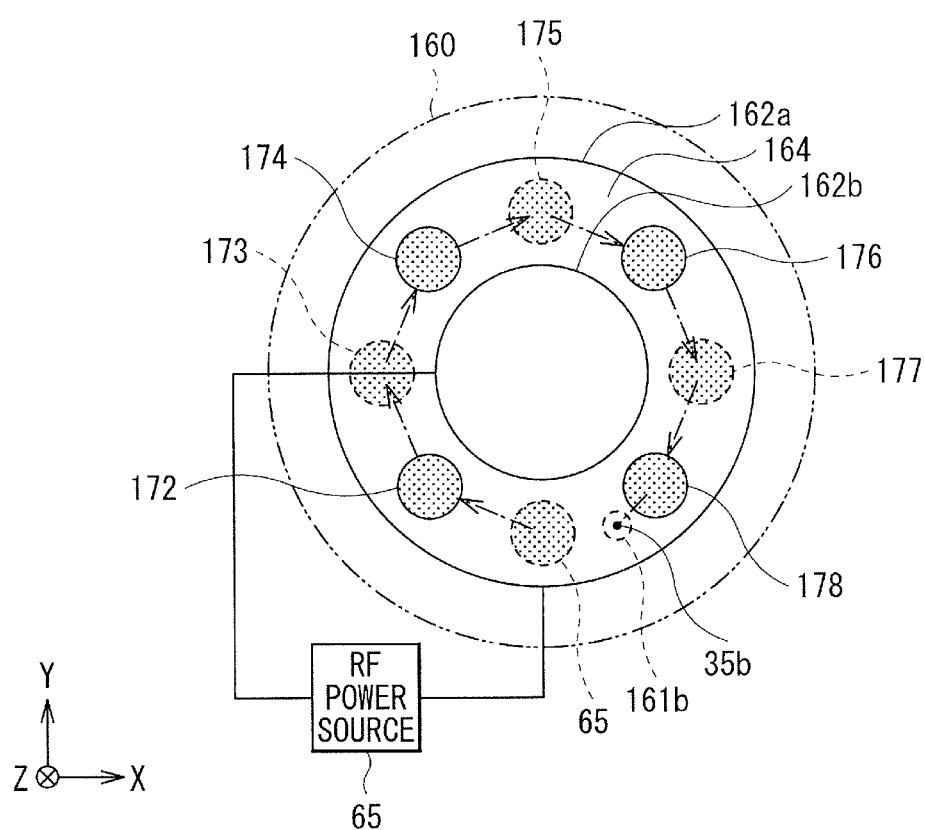
FIG. 19 schematically illustrates a configuration example of the coaxial slab amplifier illustrated in FIG. 18 as viewed from a Z direction.

FIG. 18 and FIG. 19 each illustrate a configuration example of a coaxial slab amplifier as a slab amplifier of a different type from the slab amplifier in the above-described first and second embodiments. FIG. 19 illustrates a configuration example of the coaxial slab amplifier illustrated in FIG. 18 as viewed from a Z direction in FIG. 18. The coaxial slab amplifier illustrated in FIG. 18 and FIG. 19 may be applied to one or more of the plurality of amplifiers PA1, PA2, . . . , PAk, . . . , PAn.

The coaxial slab amplifier may include a cylindrical amplification chamber 160, an input window 161a, an output window 161b, two cylindrical electrodes 162a and 162b, first to eighth mirrors 171 to 178, and the RF power source 65. The two cylindrical electrodes 162a and 162b may be coaxially disposed.

The amplification chamber 160 may contain $CO_2$ laser gas therein as the laser medium. The cylindrical electrodes 162a and 162b and the RF power source 65 may configure an excitation unit that excites the laser medium to amplify the seed light 35a that has entered the amplification chamber 160. The cylindrical electrodes 162a and 162b may be provided inside the amplification chamber 160 and may excite the laser medium in an electric discharge region 164 by electric discharge. The RF power source 65 may supply the RF voltage to the cylindrical electrodes 162a and 162b. The laser medium excited by the excitation unit may be able to amplify light of the desired wavelength as well as the light of one or more suppression target wavelengths.

The amplification chamber 160 may include a first surface and a second surface that are opposed to each other. The input window 161a, the second mirror 172, the fourth mirror 174, the sixth mirror 176, and the eighth mirror 178 may be disposed on the first surface side. The output window 161b, the first mirror 171, the third mirror 173, the fifth mirror 175, and the seventh mirror 178 may be disposed on the second surface side.

As illustrated in FIG. 19, as viewed from the Z direction in which the laser light as seed light 35a enters, the first to eighth mirrors 171 to 178 may be so disposed as not to be overlapped with one another. The first to eighth mirrors 171 to 178 may be so disposed as to reflect the entered laser light in order. The first to eighth mirrors 171 to 178 may be so disposed as to allow the entered laser light to reciprocate in a space surrounded by the two cylindrical electrodes 162a and 162b that are coaxially disposed. The entered laser light may be amplified by passing through the laser medium exited in the space surrounded by the two cylindrical electrodes 162a and 162b. The amplified laser light may be outputted as the amplified laser light 35b through the output window 161b.

In such a coaxial slab amplifier, one or more of the first to eighth mirrors 171 to 178 may be provided with the wavelength selective films similarly to the wavelength selective film in the above-described first embodiment. Also, one or both of the input window 161a and the output window 161b may be provided with the wavelength selective films similarly to the wavelength selective film in the above-described second embodiment. The wavelength selective film involving spectral reflectance characteristics illustrated in FIG. 23 described later may be provided.

[6.3 High-Speed Axial-Flow Amplifier]

Figure 20:
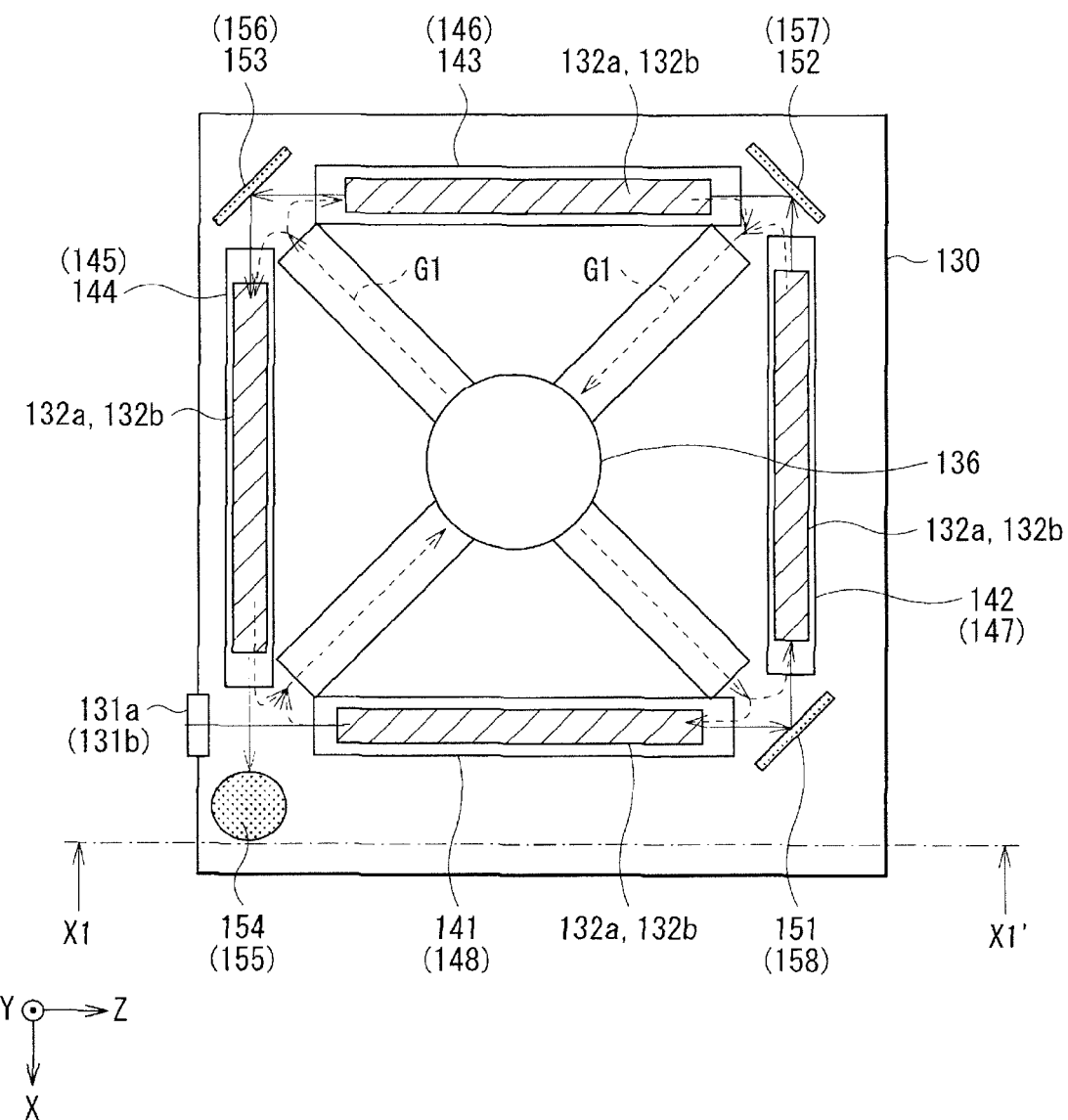
FIG. 20 schematically illustrates a configuration example of a high-speed axial-flow amplifier.
Figure 21:
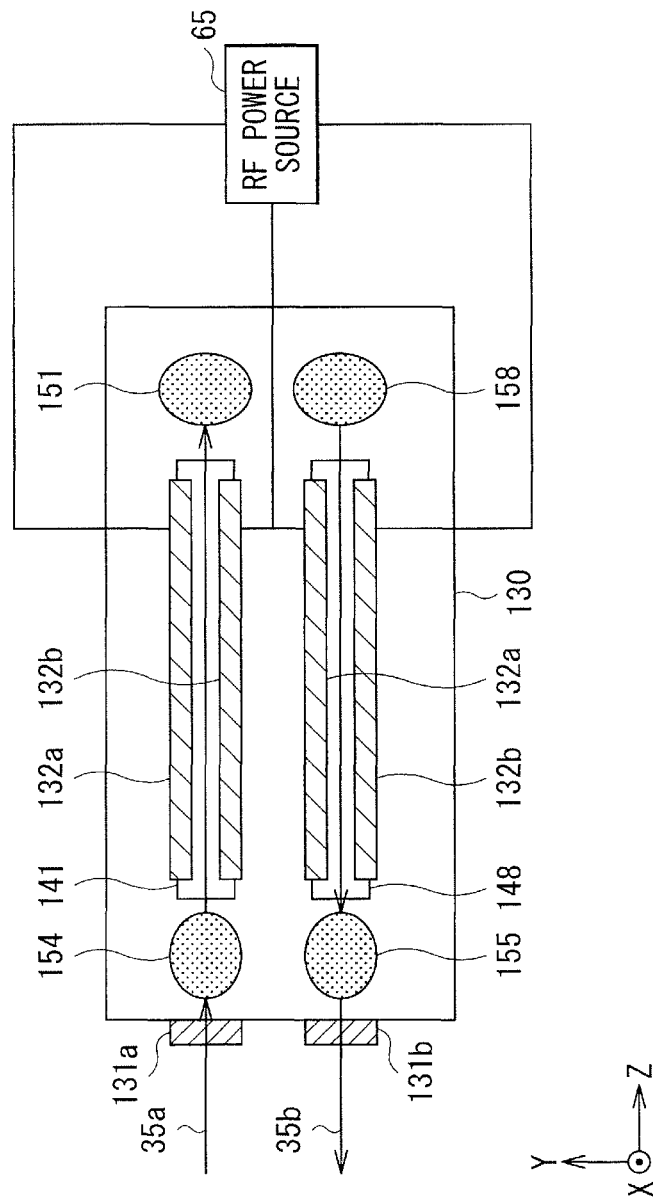
FIG. 21 schematically illustrates a configuration example of the high-speed axial-flow amplifier illustrated in FIG. 20 as viewed from a direction of a line X1-X1'.
Figure 22:
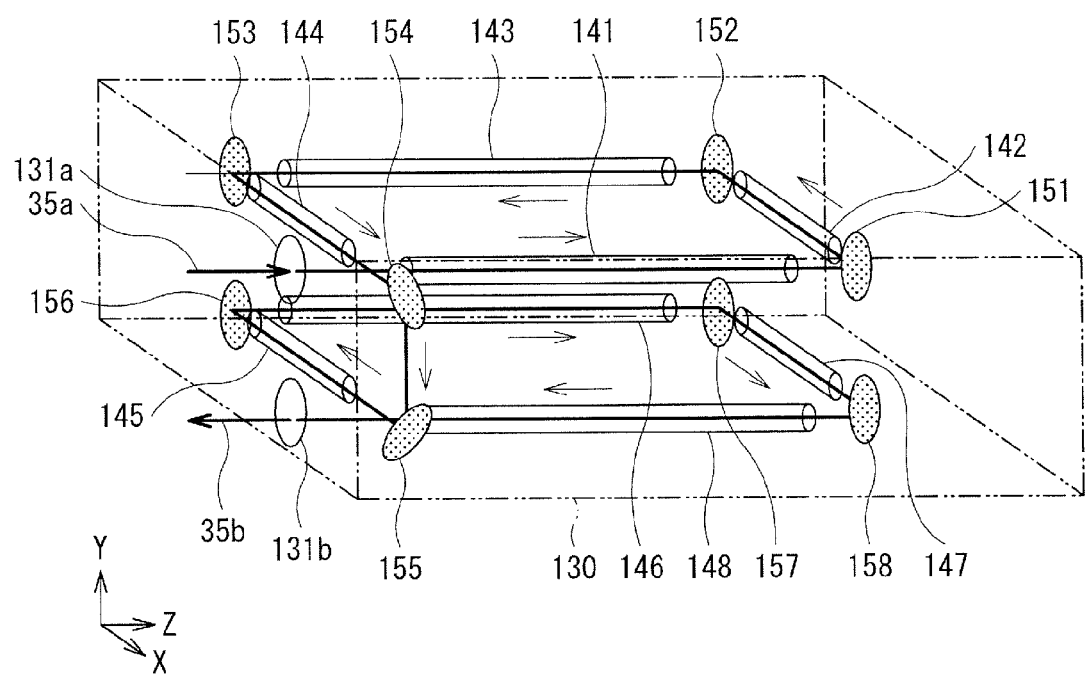
FIG. 22 schematically illustrates an example of an entire configuration of the high-speed axial-flow amplifier illustrated in FIG. 20.

FIG. 20 to FIG. 22 each illustrate a configuration example of a high-speed axial-flow amplifier as a laser amplifier of a type other than the slab amplifier. FIG. 21 illustrates a sectional configuration example of the high-speed axial-flow amplifier illustrated in FIG. 20 as viewed from a line X1-X1' direction in FIG. 20. FIG. 22 schematically illustrates an example of the entire configuration of the high-speed axial-flow amplifier illustrated in FIG. 20.

The high-speed axial-flow amplifier may include an amplification chamber 130, an input window 131a, an output window 131b, a blower 136, first to eighth electric discharge tubes 141 to 148, first to eighth mirrors 151 to 158, and the RF power source 65. Each of the first to eighth electric discharge tubes 141 to 148 may include a pair of electrodes 132a and 132b.

The inside of each of the first to eighth electric discharge tubes 141 to 148 may be filled with the $CO_2$ laser gas as a laser medium G1. In each of the first to eighth electric discharge tubes 141 to 148, the laser medium G1 may be excited by the excitation unit including the pair of electrodes 132a and 132b and the RF power source 65. The RF power source 65 may supply the RF voltage to the pair of electrodes 132a and 132b in each of the first to eighth electric discharge tubes 141 to 148. The laser medium G1 excited by the excitation unit may be able to amplify the light of the desired wavelength as well as the light of one or more suppression target wavelengths.

The high-speed axial-flow amplifier may include a vertical two-stage configuration. The input window 131a, the first to fourth electric discharge tubes 141 to 144, and the first to fourth mirrors 151 to 154 may be disposed on the upper stage side. The output window 131b, the fifth to eighth electric discharge tubes 145 to 148, and the fifth to eighth mirrors 155 to 158 may be disposed on the lower stage side.

The blower 136 may be communicated in the vertical direction to coaxially circulate the laser medium G in each of the first to eighth electric discharge tubes 141 to 148 on the upper stage side and the lower stage side.

In the high-speed axial-flow amplifier, the laser light as the seed light 35a that has entered from the Z-axis direction may pass through the input window 131a, then may enter the first electric discharge tube 141, thereby being amplified. The laser light amplified in the first electric discharge tube 141 may be reflected by the first mirror 151, and the reflected laser light may then enter the second electric discharge tube 142, thereby being amplified. The laser light amplified in the second electric discharge tube 142 may be reflected by the second mirror 152, and the reflected laser light may then enter the third electric discharge tube 143, thereby being amplified. The laser light amplified in the third electric discharge tube 143 may be reflected by the third mirror 153, and the reflected laser light may then enter the fourth electric discharge tube 144, thereby being amplified.

The laser light amplified in the fourth electric discharge tube 144 may be reflected by the fourth mirror 154 and further reflected by the fifth mirror 155, and then the laser light reflected by the fourth mirror 154 and the fifth mirror 155 may enter the fifth electric discharge tube 145, thereby being amplified. The laser light amplified in the fifth electric discharge tube 145 may be reflected by the sixth mirror 156, and the reflected laser light may then enter the sixth electric discharge tube 146, thereby being amplified. The laser light amplified in the sixth electric discharge tube 146 may be reflected by the seventh mirror 157, and the reflected laser light may then enter the seventh electric discharge tube 147, thereby being amplified. The laser light amplified in the seventh electric discharge tube 147 may be reflected by the eighth mirror 158, and the reflected laser light may then enter the eighth electric discharge tube 148, thereby being amplified.

In such a high-speed axial-flow amplifier, one or more of the first to eighth mirrors 151 to 158 may be provided with the respective wavelength selective films similar to the wavelength selective film in the above-described first embodiment. Alternatively, one or both of the input window 131a and the output window 131b may be provided with the respective wavelength selective films similar to the wavelength selective film in the above-described second embodiment. The wavelength selective film involving spectral reflectance characteristics as illustrated in FIG. 23 described later may be provided.

[6.4 Combination Example of Spectral Reflectance Characteristics of Wavelength Selective Films Applicable to Laser Amplifier Including Three or More Mirrors]

Figure 23:
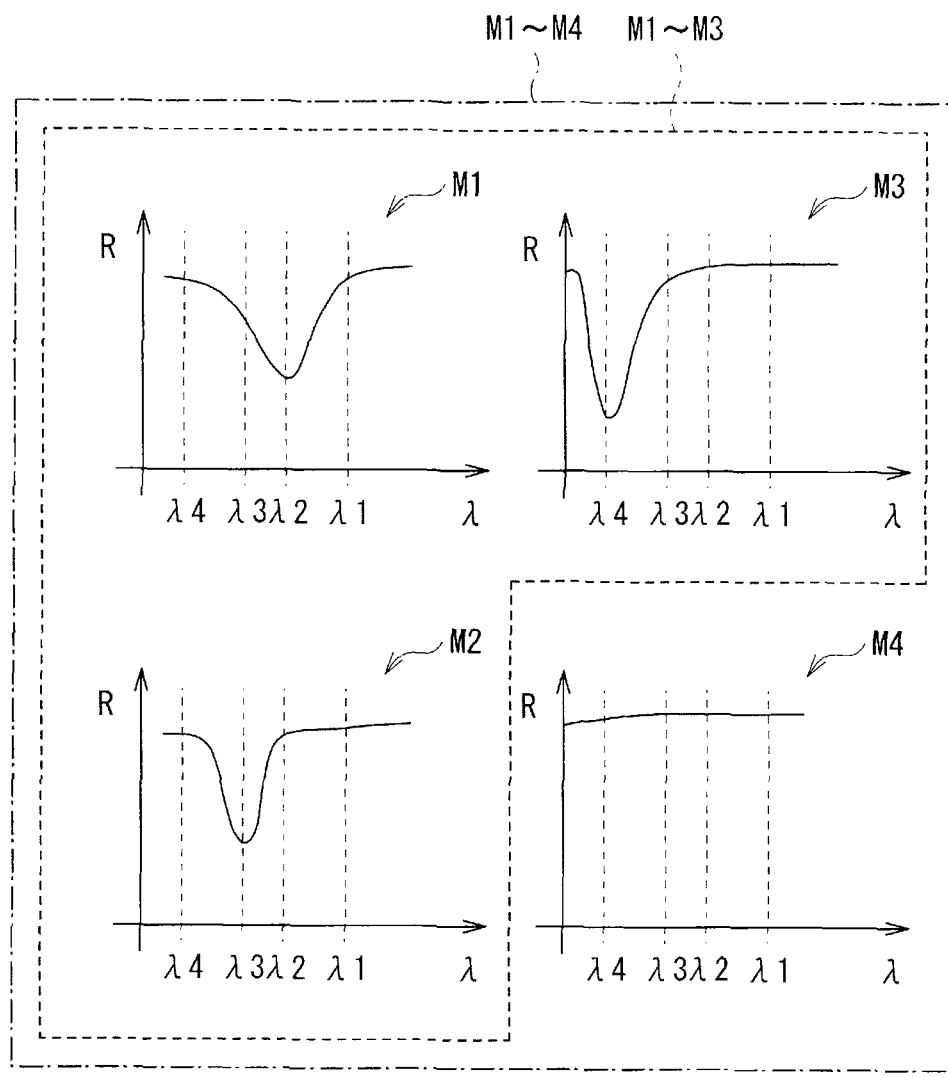
FIG. 23 illustrates a combination example of spectral reflectance characteristics of wavelength selective films applicable to a laser amplifier including three or more mirrors.

For example, three kinds of wavelength selective films involving respective spectral reflectance characteristics M1, M2, and M3 as illustrated in FIG. 23 may be applied to the laser amplifier including three or more mirrors as with the coaxial slab amplifier and the high-speed axial-flow amplifier mentioned above. Four kinds of wavelength selective films further including a wavelength selective film involving spectral reflectance characteristics M4 may be applied.

Figure 24:
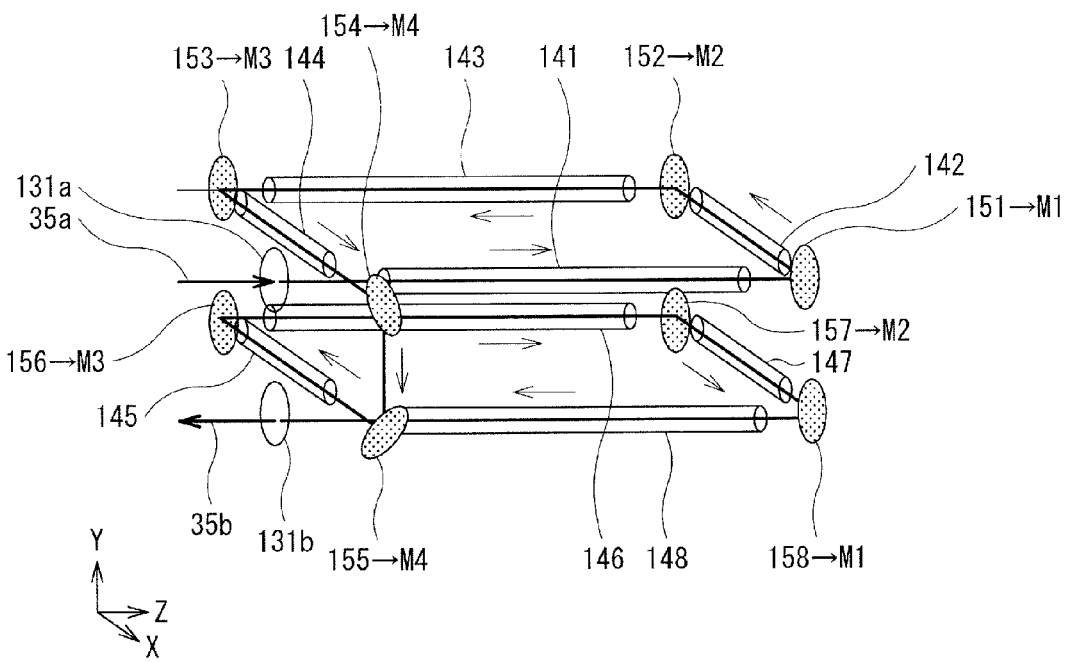
FIG. 24 illustrates a first example in which the combination of the spectral reflectance characteristics of the wavelength selective films illustrated in FIG. 23 is applied to the high-speed axial-flow amplifier.

FIG. 24 illustrates an example in which a combination of the four kinds of wavelength selective films illustrated in FIG. 23 is applied to the high-speed axial-flow amplifier. As illustrated in FIG. 24, the wavelength selective film involving the spectral reflectance characteristics M1 may be applied to the first mirror 151. The wavelength selective film involving the spectral reflectance characteristics M2 may be applied to the second mirror 152. The wavelength selective film involving the spectral reflectance characteristics M3 may be applied to the third mirror 153. The wavelength selective film involving the spectral reflectance characteristics M4 may be applied to the fourth mirror 154. The wavelength selective film involving the spectral reflectance characteristics M4 may be applied to the fifth mirror 155. The wavelength selective film involving the spectral reflectance characteristics M3 may be applied to the sixth mirror 156. The wavelength selective film involving the spectral reflectance characteristics M2 may be applied to the seventh mirror 157. The wavelength selective film involving the spectral reflectance characteristics M1 may be applied to the eighth mirror 158. As a result, the laser light may be reflected in order of the spectral reflectance characteristics of M1, M2, M3, M4, M4, M3, M2, and M1. The laser light may be reflected twice by each of four kinds of wavelength selective films in this way.

Figure 25:
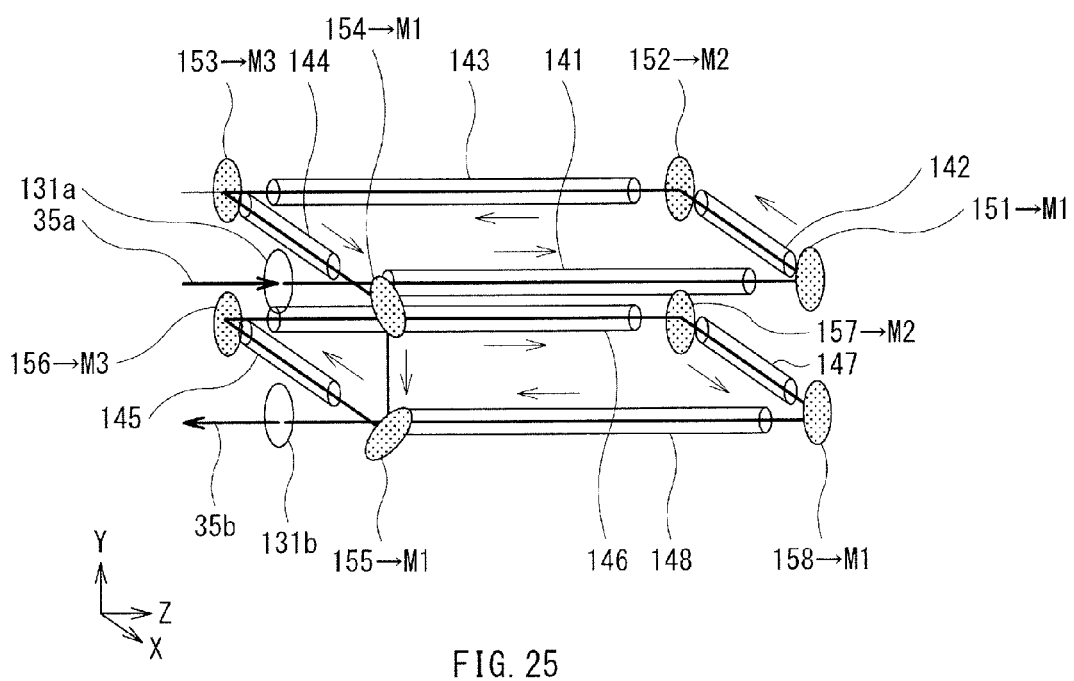
FIG. 25 illustrates a second example in which the combination of the spectral reflectance characteristics of the wavelength selective films illustrated in FIG. 23 is applied to the high-speed axial-flow amplifier.

FIG. 25 illustrates an example in which a combination of the three kinds of wavelength selective films illustrated in FIG. 23 is applied to the high-speed axial-flow amplifier. As illustrated in FIG. 25, the wavelength selective film involving the spectral reflectance characteristics M1 may be applied to the first mirror 151. The wavelength selective film involving the spectral reflectance characteristics M2 may be applied to the second mirror 152. The wavelength selective film involving the spectral reflectance characteristics M3 may be applied to the third mirror 153. The wavelength selective film involving the spectral reflectance characteristics M1 may be applied to the fourth mirror 154. The wavelength selective film involving the spectral reflectance characteristics M1 may be applied to the fifth mirror 155. The wavelength selective film involving the spectral reflectance characteristics M3 may be applied to the sixth mirror 156. The wavelength selective film involving the spectral reflectance characteristics M2 may be applied to the seventh mirror 157. The wavelength selective film involving the spectral reflectance characteristics M1 may be applied to the eighth mirror 158. As a result, the laser light may be reflected in order of the spectral reflectance characteristics of M1, M2, M3, M1, M1, M3, M2, and M1. Applying the wavelength selective film of the spectral reflectance characteristics M1 to the fourth and eighth mirrors 154 and 158 in place of the spectral reflectance characteristics M4 may effectively attenuate the light of the wavelength with relatively high gain described in FIG. 3, for example, the wavelength of $\lambda 2=10.24$ μm.

[6.5 Three-Axis Orthogonal Amplifier]

Figure 26:
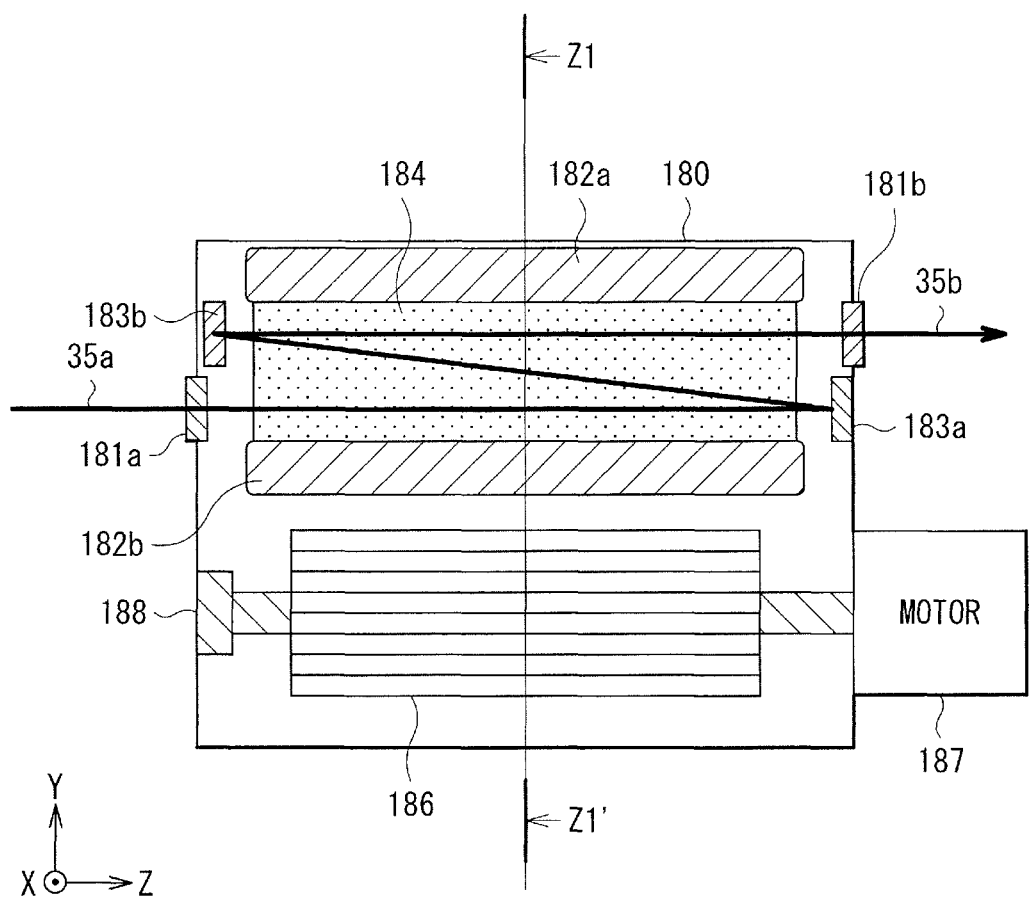
FIG. 26 schematically illustrates a configuration example of a three-axis orthogonal amplifier.
Figure 27:
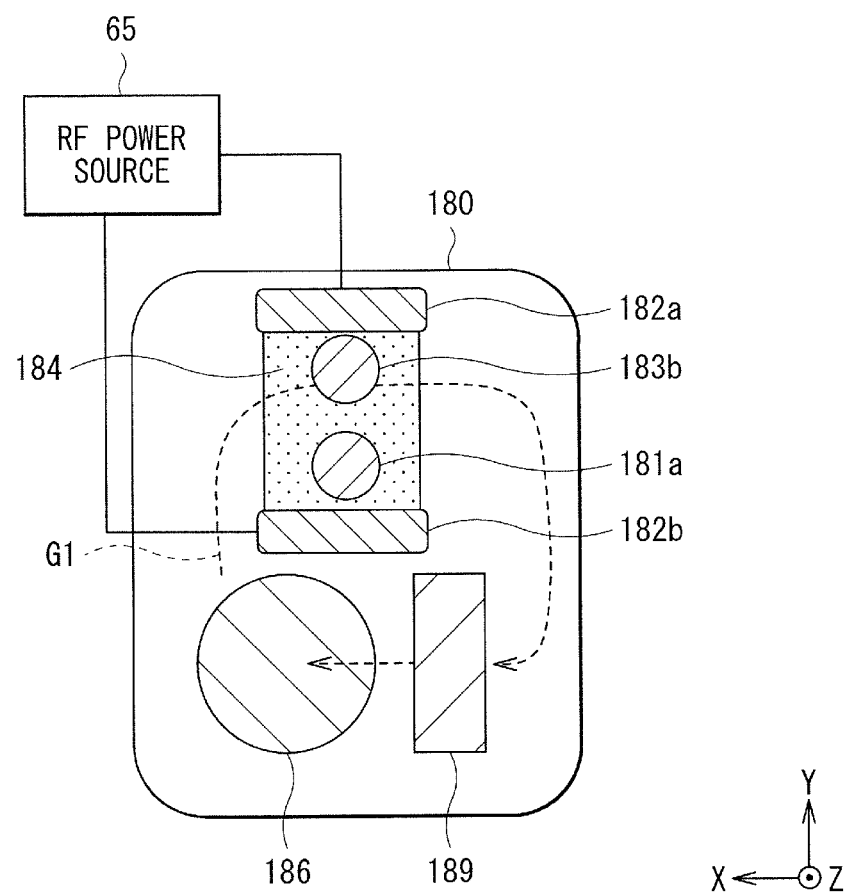
FIG. 27 schematically illustrates the configuration example of the three-axis orthogonal amplifier illustrated in FIG. 26 as viewed from a direction of a line Z1-Z1'.

FIG. 26 illustrates a configuration example of a three-axis orthogonal amplifier as still another example of the laser amplifier. FIG. 27 illustrates a sectional configuration example of the three-axis orthogonal amplifier illustrated in FIG. 26 as viewed from a line Z1-Z1' direction in FIG. 26.

The three-axis orthogonal amplifier may include an amplification chamber 180, an input window 181a, an output window 181b, a pair of electrodes 182a and 182b, a first mirror 183a, a second mirror 183b, a cross flow fan 186, and the RF power source 65. The three-axis orthogonal amplifier may further include a heat exchanger 189. A motor 187 and a bearing 188 may be respectively coupled with one end and the other end of the cross flow fan 186.

The amplification chamber 180 may contain $CO_2$ laser gas therein as the laser medium. The pair of electrodes 182a and 182b and the RF power source 65 may configure an excitation unit that excites the laser medium to amplify the seed light 35a that has entered the amplification chamber 180. The pair of electrodes 182a and 182b may be provided inside the amplification chamber 180, and may excite the laser medium in the electric discharge region 184 by electric discharge. The RF power source 65 may supply the RF voltage to the pair of electrodes 182a and 182b. The laser medium excited by the excitation unit may be able to amplify the light of the desired wavelength as well as the light of one or more suppression target wavelengths.

In the three-axis orthogonal amplifier, the laser medium G1 may be circulated and supplied to a clearance between the pair of electrodes 182a and 182b by the cross flow fan 186. The laser light to be the seed light 35a may enter the amplification chamber 180 through the input window 181a in a state where the RF power source 65 supplies the RF voltage to the pair of electrodes 182a and 182b. The entered laser light may be amplified by passing through the laser medium excited between the pair of electrodes 182a and 182b while being reflected by the first mirror 183a and the second mirror 183b in the amplification chamber 180. The amplified laser light may be outputted as the amplified laser light 35b through the output window 181b.

In such a three-axis orthogonal amplifier, a wavelength selective film similar to that in the above-mentioned first embodiment may be provided on one or both of the first mirror 183a and the second mirror 183b. A wavelength selective film similar to that in the above-mentioned second embodiment may be provided on one or both of the input window 181a and the output window 181b.

[6.6 Regenerative Amplifier]
[6.6.1 Configuration]

Figure 28:
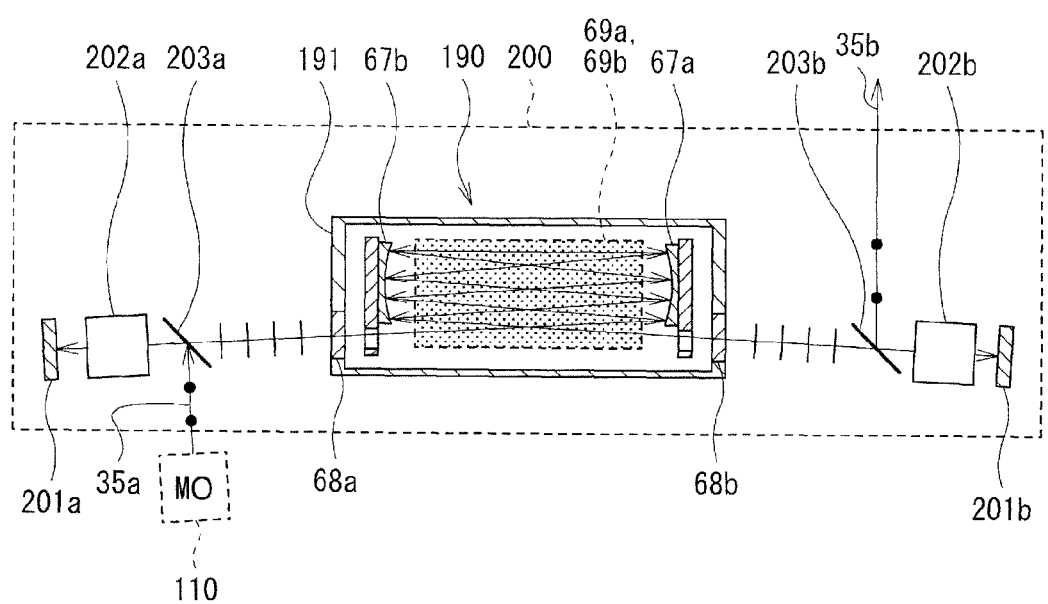
FIG. 28 schematically illustrates a configuration example of a regenerative amplifier.

FIG. 28 illustrates a regenerative amplifier 200 as another example of the laser amplifier. A wavelength selective film may be provided on one or more of mirrors and windows of the regenerative amplifier 200. The regenerative amplifier 200 illustrated in FIG. 28 may be applied to one or more of the plurality of amplifiers PA1, PA2, . . . , PAk, . . . , PAn in FIG. 2.

The regenerative amplifier 200 may include an amplifier 190, first and second resonator mirrors 201a and 201b, first and second electro-optic (EO) Pockels cells 202a and 202b, and first and second polarizers 203a and 203b. The regenerative amplifier 200 may include an unillustrated power source that applies a potential to each of the first and second EO Pockels cells 202a and 202b.

The amplifier 190 may be a three-axis orthogonal amplifier or any other amplifier besides a slab amplifier. FIG. 28 illustrates a slab amplifier as the amplifier 190. The amplifier 190 may include an amplification chamber 191, first and second concave mirrors 67a and 67b, first and second windows 68a and 68b, and a pair of electrodes 69a and 69b. The amplifier 190 may further include an unillustrated RF power source that supplies the RF voltage to the pair of electrodes 69a and 69b.

The first and second concave mirrors 67a and 67b may be provided on the laser optical path between the first window 68a and the second window 68b, and may reflect the laser light inside the amplification chamber 191. The first and second concave mirrors 67a and 67b each may be a flat mirror. The first and second windows 68a and 68b each may be provided on a wall of the amplification chamber 191.

The amplification chamber 191 may contain $CO_2$ laser gas therein as the laser medium. The pair of electrodes 69a and 69b may be so disposed inside the amplification chamber 191 to be opposed to each other in a direction orthogonal to a paper surface of FIG. 28. The pair of electrodes 69a and 69b and the unillustrated RF power source may configure an excitation unit that excites the laser medium by the electric discharge generated by the RF voltage. The laser light that has entered the amplification chamber 191 may be amplified at the time of passing through the excited laser medium. The leaser medium excited by the excitation unit may be able to amplify the light of the desired wavelength as well as the light of one or more suppression target wavelengths.

In the amplifier 190, a wavelength selective film may be provided on one or both of the first concave mirror 67a and the second concave mirror 67b as with the above-described first embodiment. Alternatively, a wavelength selective film may be provided on one or both of the first window 68a and the second window 68b as with the above-described second embodiment. Alternatively, a wavelength selective film may not be provided on any of the first concave mirror 67a, the second concave mirror 67b, the first window 68a, and the second window 68b.

In the regenerative amplifier 200, the first resonator mirror 201a and the second resonator mirror 201b may configure a resonator. The first and second EO Pockels cells 202a and 202b, the first and second polarizers 203a and 203b, and the amplifier 190 may be disposed on the optical path between the first resonator mirror 201a and the second resonator mirror 201b. A wavelength selective film similar to that of the first embodiment may be provided on one or both of the first resonator mirror 201a and the second resonator mirror 201b.

The first and second polarizers 203a and 203b may involve a function of a mirror. A wavelength selective film similar to that of the first embodiment may be provided on one or both of the first polarizer 203a and the second polarizer 203b. The first and second polarizers 203a and 203b may possess characteristics to allow the P-polarized light and the S-polarized light to pass therethrough with high transmittance, with respect to the light of the wavelengths of 9.27 μm, 9.59 μm, and 10.24 μm. The first and second polarizers 203a and 203b may involve characteristics to reflect the S-polarized light with high reflectivity and to allow the P-polarized light to pass therethrough with high transmittance, with respect to light of the wavelength of 10.59 μm. The S-polarized light may be polarized light in a direction perpendicular to the paper surface in FIG. 28, and the P-polarized light may be polarized light in a direction parallel to the paper surface in FIG. 28. Note that, in FIG. 28, a black dot provided on the optical path may indicate a polarization direction perpendicular to the paper surface, and a solid line that is so provided on the optical path as to be orthogonal to the optical path may indicate a polarization direction parallel to the paper surface.

The regenerative amplifier 200 may be configured to receive, as the seed light 35a, the pulsed laser light outputted from the master oscillator 110. The master oscillator 110 may be a quantum-cascade laser (QCL) oscillating in an amplification wavelength range of $CO_2$ laser. The regenerative amplifier 200 may be configured to receive, as the seed light 35a, laser light outputted from any other amplifier without limitation to the pulsed laser light outputted from the master oscillator 110.

[6.2.2 Operation]

The regenerative amplifier 200 may apply a potential by an unillustrated power source to operate the first EO Pockels cell 202a. The master oscillator 110 may output laser light of a polarization direction perpendicular to the paper surface of FIG. 28, for example. The laser light outputted from the master oscillator 110 may be reflected by the first polarizer 203a, and the reflected laser light may then pass through the first EO Pockels cell 202a supplied with a potential. The laser light may be reflected by the first polarizer 203a, the reflected laser light may enter the first EO Pockels cell 202a and then pass through the first EO Pockels cell 202a, thereby being converted into circular polarized light. Thereafter, the circular-polarized laser light may be reflected by the first resonator mirror 201a, and the reflected laser light may pass through the first EO Pockels cell 202a again to be converted into polarized light of a direction parallel to the paper surface of FIG. 28.

After the laser light passes through the first EO Pockels cell 202a again, the unillustrated power source for the first EO Pockels cell 202a may be turned off. The laser light that has passed through the first EO Pockels cell 202a again may pass through the first polarizer 203a and then may enter the amplifier 190 through the first window 68a. The laser light that has entered the amplifier 190 may be reflected multiple times between the first concave mirror 67a and the second concave mirror 67b to be amplified in the amplification chamber 191, and the amplified laser light may be outputted from the second window 68b.

The laser light outputted through the second window 68b may pass through the second polarizer 203b with high transmittance and pass through the second EO Pockels cell 202b to which a potential is not applied by the unillustrated power source. The laser light that has passed through the second EO Pockels cell 202b may be reflected by the second resonator mirror 201b. Then, the reflected laser light may pass through the second EO Pockels cell 202b and the second polarizer 203b again with high transmittance while being polarized in a direction parallel to the paper surface. Thereafter, the laser light may enter the amplifier 190 again through the second window 68b. The laser light that has entered the amplifier 190 may be amplified in the amplification chamber 191 by being reflected multiple times between the first concave mirror 67a and the second concave mirror 67b, and then amplified laser light may be outputted through the first window 68a. The laser light outputted through the first window 68a may pass through the first polarizer 203a and the first EO Pockels cell 202a with high transmittance and then may be reflected by the first resonator mirror 201a. The reflected laser light may pass through the first EO Pockels cell 202a and the first polarizer 203a again with high transmittance.

Through repetition of the foregoing example processes, the laser light may reciprocate in the resonator between the first resonator mirror 201a and the second resonator mirror 201b, thereby being amplified. When the regenerative amplified light by the resonator is to be outputted to the outside, the unillustrated power source for the second EO Pockels cell 202b may be turned on. This may convert the laser light polarized in a direction parallel to the paper surface into laser light polarized in a direction perpendicular to the paper surface, and the regenerative amplified light may be reflected by the second polarizer 203b at high reflectance to be outputted as the amplified laser light 35b to the outside.

[6.6.3 Effects]

In the regenerative amplifier 200, amplification of light of wavelengths other than the desired wavelength reflected by the first and second resonator mirrors 201a and 201b may be suppressed. As a result, the laser light of the desired wavelength may be amplified, whereas the self-oscillation by the light of wavelengths other than the desired wavelength may be suppressed. In the regenerative amplifier 200, the amplifier 190 may include a wavelength selective film similar to that of the first or second embodiment, and the similar wavelength selective film may be applied to the first and second resonator mirrors 201a and 201b as well. Further, the function of a mirror provided with the similar wavelength selective film may be added to the first and second polarizers 203a and 203b. This may further suppress self-oscillation by the light of the wavelengths other than the desired wavelength.

In addition to the above-described configurations, for example, a wavelength selective film similar to that in the foregoing second embodiment may be provided on light input/output end surfaces in the first and second EO Pockels cells 202a and 202b.

[7. Others]

The foregoing description is intended to be merely illustrative rather than limiting. It should therefore be appreciated that variations may be made in example embodiments of the disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. A laser amplifier, comprising:
    a chamber containing a laser medium;
    a first window provided on the chamber, and tilted to allow a laser light beam of a desired wavelength inputted from outside of the chamber to enter the chamber and to allow light beams of one or more suppression target wavelengths different from the desired wavelength to be off a light path of the laser light beam of the desired wavelength;
    an excitation unit configured to amplify, by exciting the laser medium, the laser light beam that has entered the chamber;
    a second window provided on the chamber, and tilted to allow the laser light beam that has been amplified by the excitation unit to exit from the chamber to the outside and to allow the light beams of the one or more suppression target wavelengths to be off the light path of the laser light beam of the desired wavelength;
    a mirror provided on a laser light path between the first window and the second window; and
    a wavelength selection film provided on one or more of the first window, the second window, and the mirror, and configured to suppress propagation of the light beams of the one or more suppression target wavelengths.

2. The laser amplifier according to claim 1, wherein the laser medium that has been excited by the excitation unit is adapted to amplify a light beam of the desired wavelength as well as light beams of the suppression target wavelengths.

3. The laser amplifier according to claim 1, wherein
the mirror includes a plurality of mirrors, and
the wavelength selection film is provided on one or more of the mirrors.

4. The laser amplifier according to claim 3, wherein
the wavelength selection film is provided on each of two or more of the mirrors, and
two or more of the wavelength selective films provided on the two or more of the mirrors are different, in wavelength selection property, from one another.

5. The laser amplifier according to claim 1, wherein the wavelength selection film is provided on the mirror, and exhibits higher reflectivity with respect to a light beam of the desired wavelength than with respect to the light beams of the suppression target wavelengths.

6. The laser amplifier according to claim 1, wherein the wavelength selection film is provided on one or both of the first window and the second window, and exhibits higher transmittance with respect to a light beam of the desired wavelength than with respect to the light beams of the suppression target wavelengths.

7. A laser apparatus, comprising:
a master oscillator configured to output a laser light beam of a desired wavelength; and
one or more laser amplifiers each configured to amplify the laser light beam derived from the master oscillator, one or more of the laser amplifiers each including:
a chamber containing a laser medium;
a first window provided on the chamber, and tilted to allow the laser light beam of the desired wavelength inputted from outside of the chamber to enter the chamber and to allow light beams of one or more suppression target wavelengths different from the desired wavelength to be off a light path of the laser light beam of the desired wavelength;
an excitation unit configured to amplify, by exciting the laser medium, the laser light beam that has entered the chamber;
a second window provided on the chamber, and tilted to allow the laser light beam that has been amplified by the excitation unit to exit from the chamber to the outside and to allow the light beams of the one or more suppression target wavelengths to be off the light path of the laser light beam of the desired wavelength;
a mirror provided on a laser light path between the first window and the second window; and
a wavelength selection film provided on one or more of the first window, the second window, and the mirror, and configured to suppress propagation of the light beams of the one or more suppression target wavelengths.

8. An extreme ultraviolet light generating system, comprising:
a plasma chamber in which extreme ultraviolet light is to be generated; and
a laser apparatus configured to supply a pulsed laser light beam into the plasma chamber, the laser apparatus including:
a master oscillator configured to output a laser light beam of a desired wavelength as a seed of the pulsed laser light beam; and
one or more laser amplifiers each configured to amplify the laser light beam derived from the master oscillator, one or more of the laser amplifiers each including:
an amplification chamber containing a laser medium;
a first window provided on the amplification chamber, and tilted to allow the laser light beam of the desired wavelength inputted from outside of the amplification chamber to enter the amplification chamber and to allow light beams of one or more suppression target wavelengths different from the desired wavelength to be off a light path of the laser light beam of the desired wavelength;
an excitation unit configured to amplify, by exciting the laser medium, the laser light beam that has entered the amplification chamber;
a second window provided on the amplification chamber, and tilted to allow the laser light beam that has been amplified by the excitation unit to exit from the amplification chamber to the outside and to allow the light beams of the one or more suppression target wavelengths to be off the light path of the laser light beam of the desired wavelength;
a mirror provided on a laser light path between the first window and the second window; and
a wavelength selection film provided on one or more of the first window, the second window, and the mirror, and configured to suppress propagation of the light beams of the one or more suppression target wavelengths.

\* \* \* \* \*